US012160227B2

(12) United States Patent
Takahashi

(10) Patent No.: US 12,160,227 B2
(45) Date of Patent: Dec. 3, 2024

(54) SEMICONDUCTOR DEVICE, ELECTRONIC APPLIANCE, AND VEHICLE

(71) Applicant: Rohm Co., Ltd., Kyoto (JP)

(72) Inventor: Naoki Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 218 days.

(21) Appl. No.: 17/545,364

(22) Filed: Dec. 8, 2021

(65) Prior Publication Data

US 2022/0209766 A1 Jun. 30, 2022

(30) Foreign Application Priority Data

Dec. 25, 2020 (JP) ................................ 2020-216375

(51) Int. Cl.
| | | |
|---|---|---|
| H03K 17/0812 | (2006.01) | |
| H01L 27/02 | (2006.01) | |
| H01L 27/088 | (2006.01) | |
| H01L 29/423 | (2006.01) | |

(52) U.S. Cl.
CPC ... *H03K 17/08122* (2013.01); *H01L 27/0266* (2013.01); *H01L 27/0886* (2013.01); *H01L 29/42384* (2013.01)

(58) Field of Classification Search
CPC .......... H03K 17/822; H03K 17/08122; H03K 17/08–0822; H01L 27/0266
See application file for complete search history.

(56) References Cited

U.S. PATENT DOCUMENTS

| | | |
|---|---|---|
| 9,780,660 B2 | 10/2017 | Hashimoto et al. |
| 10,038,380 B2 | 7/2018 | Hashimoto et al. |
| 2013/0256783 A1* | 10/2013 | Katou ............... H01L 29/66621 |
| | | 438/237 |
| 2016/0118891 A1 | 4/2016 | Hashimoto et al. |
| 2016/0133742 A1* | 5/2016 | Okuda .............. H01L 23/49562 |
| | | 438/270 |
| 2017/0092759 A1* | 3/2017 | Okuda .............. H01L 23/49575 |
| 2017/0373599 A1 | 12/2017 | Hashimoto et al. |
| 2018/0048140 A1* | 2/2018 | Takuma ................. H02H 9/025 |
| 2019/0115290 A1* | 4/2019 | Okuda .................... H01L 21/76 |

(Continued)

FOREIGN PATENT DOCUMENTS

| | | |
|---|---|---|
| JP | H04134271 | 5/1992 |
| JP | H11097677 | 4/1999 |
| JP | 2005333691 | 12/2005 |

(Continued)

OTHER PUBLICATIONS

JP OA—Japanese Patent Office, Office Action in Japanese Appln. No. 2020-216375, dated Jul. 16, 2024, 8 pages (with English translation).

*Primary Examiner* — Syed I Gheyas
*Assistant Examiner* — Casey Paul Boatman
(74) *Attorney, Agent, or Firm* — Fish & Richardson P.C.

(57) ABSTRACT

For example, a semiconductor device includes a split-gate power transistor configured to have a plurality of channel regions controlled individually according to a plurality of gate control signals, a gate control circuit configured to generate the plurality of gate control signals, and an over-current protection circuit configured to turn off at least one of the plurality of channel regions when the output current passing through the power transistor exceeds a threshold voltage.

7 Claims, 13 Drawing Sheets

(56) References Cited

U.S. PATENT DOCUMENTS

2020/0312975 A1* 10/2020 Fukuda ............... H01L 29/7813
2022/0352145 A1* 11/2022 Takuma ............... H01L 29/0696

FOREIGN PATENT DOCUMENTS

| | | |
|---|---|---|
| JP | 2015046954 | 3/2015 |
| JP | 2019212930 | 12/2019 |
| JP | 2020053466 | 4/2020 |
| WO | WO 2014/181450 | 11/2014 |

* cited by examiner

SEMICONDUCTOR DEVICE, ELECTRONIC APPLIANCE, AND VEHICLE

This application is based on Japanese Patent Application No. 2020-216375 filed on Dec. 25, 2020, the contents of which are hereby incorporated by reference.

BACKGROUND OF THE INVENTION

1. Field of the Invention

The invention disclosed herein relates to semiconductor devices, electronic appliances, and vehicles.

2. Description of Related Art

Many known semiconductor devices includes an overcurrent protection circuit as one kind of fault protection circuit. For example, a vehicle-mounted IPD (intelligent power device) includes an overcurrent protection circuit that limits the output current passing through a power transistor to or below a set overcurrent value to prevent destruction of the device in case of a short circuit across the load connected to the power transistor.

An example of known technology related to what has just been mentioned is seen in Japanese unexamined patent application publication No. 2015-46954.

Unfortunately, known semiconductor devices leave room for further improvement in terms of reducing the scale of the overcurrent protection circuit (and hence reducing the prices of products).

SUMMARY OF THE INVENTION

In view of the above-mentioned problem encountered by the present inventor, an object of the invention disclosed herein is to provide a semiconductor device, an electronic appliance, and a vehicle that achieve overcurrent protection with a simpler configuration.

For example, according to what is disclosed herein, a semiconductor device includes: a split-gate power transistor configured to have a plurality of channel regions that are controlled individually in accordance with a plurality of gate control signals; a gate control circuit configured to generate the plurality of gate control signals; and an overcurrent protection circuit configured to turn off at least one of the plurality of channel regions when the output current that passes through the power transistor exceeds a threshold voltage.

Other features, elements, steps, benefits, and characteristics of the present invention will become clear through the following detailed description of embodiments and the accompanying drawings associated therewith.

DETAILED DESCRIPTION OF PREFERRED EMBODIMENTS

Semiconductor Device: Various embodiments directed to semiconductor devices will be described below with reference to the accompanying drawings.

Figure 1:
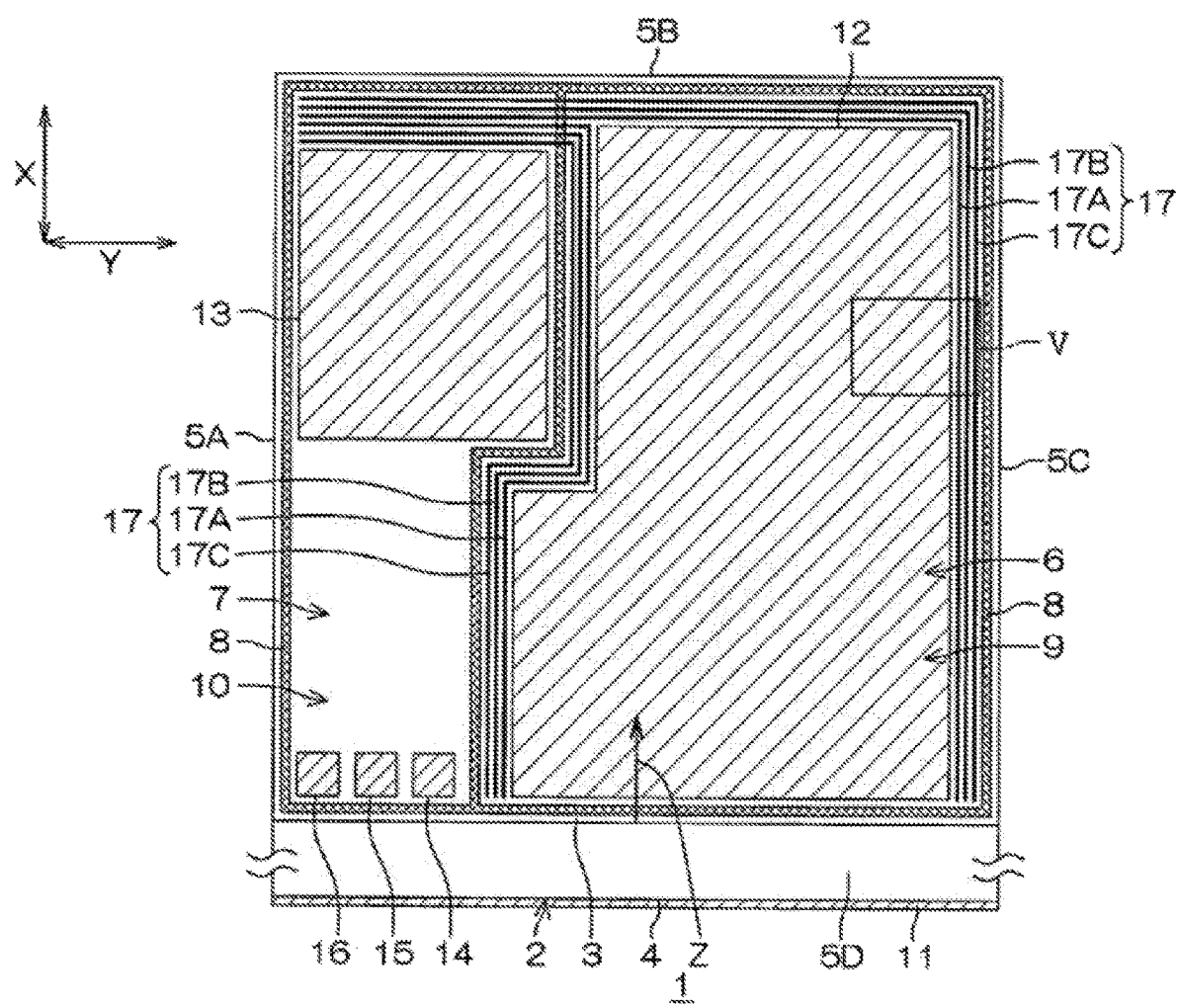
FIG. 1 is a perspective view of a semiconductor device as seen from one direction.

FIG. 1 is a perspective view of a semiconductor device 1 as viewed from one direction. Hereinafter, a description will be given of a configuration example in which the semiconductor device 1 is a high-side switching device. However, the semiconductor device 1 is not restricted to the high-side switching device. The semiconductor device 1 can also be provided as a low-side switching device by adjusting electrical connection configurations and functions of various structures.

With reference to FIG. 1, the semiconductor device 1 includes a semiconductor layer 2. The semiconductor layer 2 includes silicon. The semiconductor layer 2 is formed in a rectangular parallelepiped chip shape. The semiconductor layer 2 has a first main surface 3 on one side, a second main surface 4 on the other side, and side surfaces 5A, 5B, 5C, and 5D connecting the first main surface 3 and the second main surface 4.

The first main surface 3 and the second main surface 4 are each formed in a rectangular shape in plan view when viewed from a normal direction Z thereof (hereinafter, simply referred to as "plan view"). The side surface 5A and the side surface 5C extend along a first direction X and face each other in a second direction Y which intersects the first direction X. The side surface 5B and the side surface 5D extend along the second direction Y and face each other in the first direction X. Specifically, the second direction Y is orthogonal to the first direction X.

An output region 6 and an input region 7 are defined in the semiconductor layer 2. The output region 6 is defined in a region at the side surface 5C side. The input region 7 is defined in a region at the side surface 5A side. In plan view, an area SOUT of the output region 6 is equal to or larger than an area SIN of the input region 7 (SIN≤SOUT).

A ratio SOUT/SIN of the area SOUT with respect to the area SIN may be from not less than 1 to not more than 10 (1≤SOUT/SIN≤10). The ratio SOUT/SIN may be from not less than 1 to not more than 2, from not less than 2 to not more than 4, from not less than 4 to not more than 6, from not less than 6 to not more than 8, or from not less than 8 to not more than 10. Planar shapes of the input region 7 and the output region 6 are arbitrary and not restricted to particular shapes. As a matter of course, the ratio SOUT/SIN may be in excess of 0 and less than 1.

The output region 6 includes a power MISFET (Metal Insulator Semiconductor Field Effect Transistor) 9 as an example of an insulation gate type transistor. The power MISFET 9 includes a gate, a drain, and a source.

The input region 7 includes a control IC (Integrated Circuit) 10 as an example of a control circuit. The control IC 10 includes plural types of functional circuits which realize various functions. The plural types of functional circuits include a circuit generating gate control signals which drive and control the power MISFET 9 based on an external electrical signal. The control IC 10 forms a so-called IPD (Intelligent Power Device) together with the power MISFET 9. The IPD is also referred to as an IPM (Intelligent Power Module).

The input region 7 is electrically insulated from the output region 6 by a region separation structure 8. In FIG. 1, the region separation structure 8 is indicated by hatching. Although a specific description shall be omitted, the region separation structure 8 may have a trench insulating structure in which an insulator is embedded in the trench.

On the semiconductor layer 2, a plurality of (in this embodiment, six) of electrodes 11, 12, 13, 14, 15, and 16 are formed. In FIG. 1, the plurality of electrodes 11 to 16 are indicated by hatching. Each of the electrodes 11 to 16 is formed as a terminal electrode to be externally connected by a lead wire (for example, bonding wire), etc. The number, the arrangement, and the shape of the plurality of electrodes 11 to 16 are arbitrary and are not restricted to the configuration shown in FIG. 1.

The number, the arrangement, and the shape of the plurality of electrodes 11 to 16 are adjusted according to the specification of the power MISFET 9 and/or the specification of the control IC 10. In this embodiment, the plurality of electrodes 11 to 16 include a drain electrode 11 (power supply electrode), a source electrode 12 (output electrode), an input electrode 13, a reference voltage electrode 14, an ENABLE electrode 15, and a SENSE electrode 16.

The drain electrode 11 is formed on the second main surface 4 of the semiconductor layer 2. The drain electrode 11 is electrically connected to the second main surface 4 of the semiconductor layer 2. The drain electrode 11 transmits a power supply voltage VB to the drain of the power MISFET 9 and to various types of circuits of the control IC 10.

The drain electrode 11 may include at least any one of a Ti layer, a Ni layer, an Au layer, an Ag layer and an Al layer. The drain electrode 11 may have a single layer structure which includes a Ti layer, a Ni layer, an Au layer, an Ag layer, or an Al layer. The drain electrode 11 may have a laminated structure in which at least two of a Ti layer, a Ni layer, an Au layer, an Ag layer, and an Al layer are laminated in any given manner.

The source electrode 12 is formed on the output region 6 in the first main surface 3. The source electrode 12 is electrically connected to the source of the power MISFET 9. The source electrode 12 transmits an electrical signal generated by the power MISFET 9 to the outside.

The input electrode 13, the reference voltage electrode 14, the ENABLE electrode 15, and the SENSE electrode 16 are each formed on the input region 7 in the first main surface 3. The input electrode 13 transmits an input voltage for driving the control IC 10.

The reference voltage electrode 14 transmits the reference voltage (for example, a ground voltage) to the control IC 10. The ENABLE electrode 15 transmits an electrical signal for partially or totally enabling or disabling functions of the control IC 10. The SENSE electrode 16 transmits an electrical signal for detecting malfunction of the control IC 10.

A gate control wiring 17 as an example of a control wiring is also formed anywhere on the semiconductor layer 2. The gate control wiring 17 is selectively laid around on the output region 6 and on the input region 7. The gate control wiring 17 is electrically connected to the gate of the power MISFET 9 in the output region 6 and electrically connected to the control IC 10 in the input region 7.

The gate control wiring 17 transmits gate control signals generated by the control IC 10 to the gate of the power MISFET 9. The gate control signals include an ON signal Von and an OFF signal Voff, and control an ON state and an OFF state of the power MISFET 9.

The ON signal Von is higher than a gate threshold voltage Vth of the power MISFET 9 (Vth≤Von). The OFF signal Voff is lower than the gate threshold voltage Vth of the power MISFET 9 (Voff≤Vth). The OFF signal Voff may be the reference voltage (for example, the ground voltage).

In this embodiment, the gate control wiring 17 includes a first gate control wiring 17A, a second gate control wiring 17B, and a third gate control wiring 17C. The first gate control wiring 17A, the second gate control wiring 17B, and the third gate control wiring 17C are electrically insulated from each other.

In this embodiment, two first gate control wirings 17A are laid around in different regions. Two second gate control wirings 17B are also laid around in different regions. Further, two third gate control wirings 17C are laid around in different regions.

The first gate control wiring 17A, the second gate control wiring 17B, and the third gate control wiring 17C transmit the same gate control signal or different gate control signals to the gate of the power MISFET 9. The number, the arrangement, and the shape, etc., of the gate control wiring 17 are arbitrary and adjusted in accordance with a transmitted distance of the gate control signals and/or the number of the gate control signals to be transmitted.

The source electrode 12, the input electrode 13, the reference voltage electrode 14, the ENABLE electrode 15, the SENSE electrode 16, and the gate control wiring 17 may each include at least any one of nickel, palladium, aluminum, copper, an aluminum alloy, and a copper alloy.

The source electrode 12, the input electrode 13, the reference voltage electrode 14, the ENABLE electrode 15, the SENSE electrode 16, and the gate control wiring 17 may each include at least any one of an Al—Si—Cu (aluminum-silicon-copper) alloy, an Al—Si (aluminum-silicon) alloy, and an Al—Cu (aluminum-copper) alloy.

The source electrode 12, the input electrode 13, the reference voltage electrode 14, the ENABLE electrode 15, the SENSE electrode 16, and the gate control wiring 17 may include the same type of electrode material or may include an electrode material which is different from each other.

Figure 2:
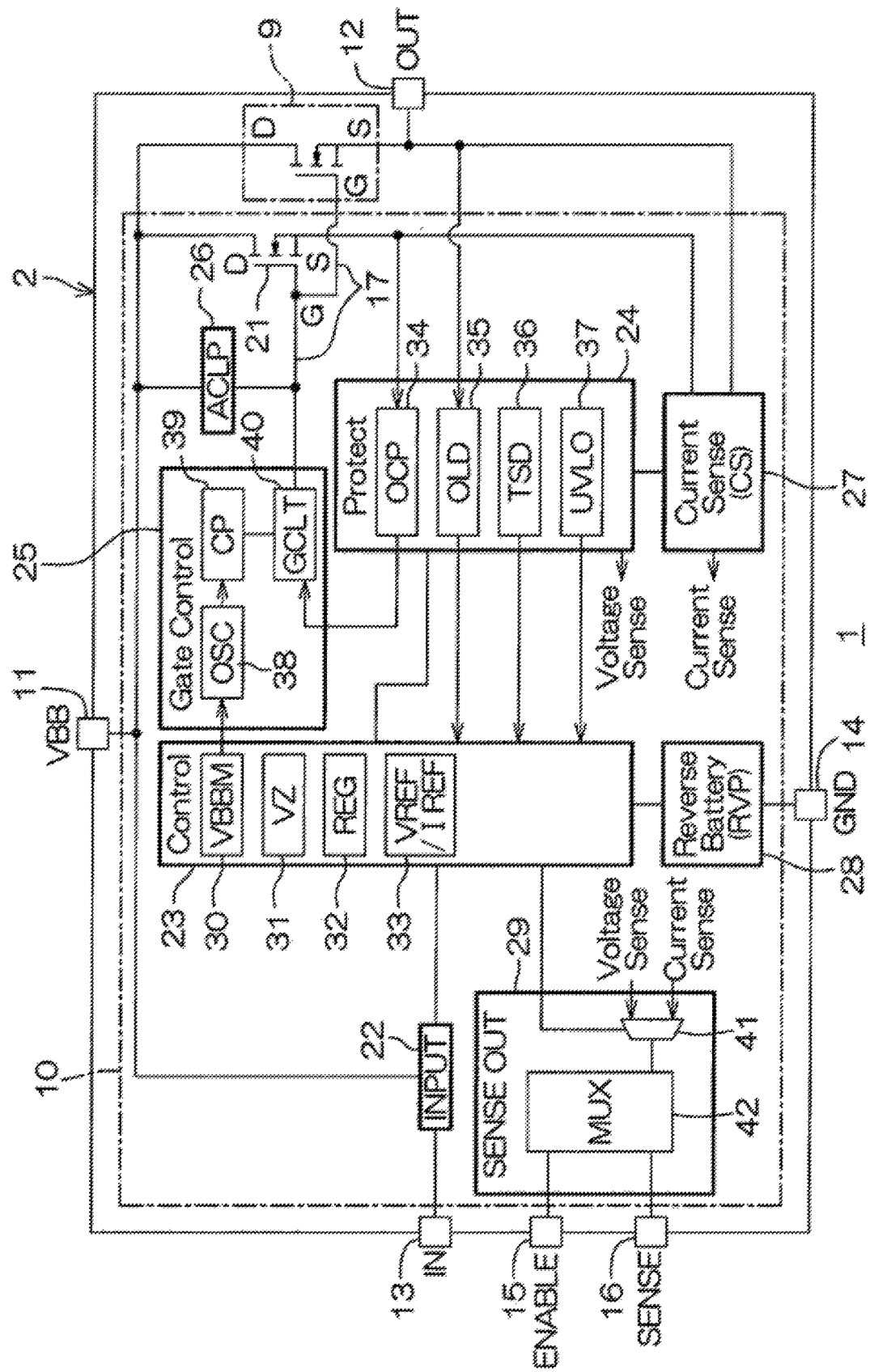
FIG. 2 is a block diagram showing an electrical structure of a semiconductor device.

FIG. 2 is a block circuit diagram which shows an electrical configuration of the semiconductor device 1 shown in FIG. 1. Hereinafter, a description will be given of an example in which the semiconductor device 1 is adopted into a vehicle.

The semiconductor device 1 includes a drain electrode 11, a source electrode 12, an input electrode 13, the reference voltage electrode 14, an ENABLE electrode 15, a SENSE electrode 16, a gate control wiring 17, a power MISFET 9, and a control IC 10.

The drain electrode 11 is connected to a power supply. The drain electrode 11 supplies a power supply voltage VB to the power MISFET 9 and the control IC 10. The power supply voltage VB may be from not less than 10 V to not more than 20 V. The source electrode 12 is connected to a load.

The input electrode 13 may be connected to an MCU (Micro Controller Unit), a DC/DC converter, an LDO (Low Drop Out), etc. The input electrode 13 supplies an input voltage to the control IC 10. The input voltage may be from not less than 1 V to not more than 10 V. The reference voltage electrode 14 is connected to the reference voltage wiring. The reference voltage electrode 14 supplies the reference voltage to the power MISFET 9 and the control IC 10.

The ENABLE electrode 15 may be connected to an MCU. An electrical signal partially or totally enabling or disabling functions of the control IC 10 is input to the ENABLE electrode 15. The SENSE electrode 16 may be connected to a resistor.

The gate of the power MISFET 9 is connected to the control IC 10 (a gate control circuit 25 to be described later) through the gate control wiring 17. The drain of the power MISFET 9 is connected to the drain electrode 11. The source of the power MISFET 9 is connected to the control IC 10 (a current detecting circuit 27 to be described later) and the source electrode 12.

The control IC 10 includes a sensor MISFET 21, an input circuit 22, a current-voltage control circuit 23, a protection circuit 24, a gate control circuit 25, an active clamp circuit 26, a current detecting circuit 27, a power-supply reverse connection protection circuit 28, and a malfunction detection circuit 29.

A gate of the sensor MISFET 21 is connected to the gate control circuit 25. A drain of the sensor MISFET 21 is connected to the drain electrode 11. A source of the sensor MISFET 21 is connected to the current detecting circuit 27.

The input circuit 22 is connected to the input electrode 13 and the current-voltage control circuit 23. The input circuit 22 may include a Schmitt trigger circuit. The input circuit 22 shapes a waveform of an electrical signal applied to the input electrode 13. The signal generated by the input circuit 22 is input to the current-voltage control circuit 23.

The current-voltage control circuit 23 is connected to the protection circuit 24, the gate control circuit 25, the power-supply reverse connection protection circuit 28, and the malfunction detection circuit 29. The current-voltage control circuit 23 may include a logic circuit.

The current-voltage control circuit 23 generates various voltages according to an electrical signal from the input circuit 22 and an electrical signal from the protection circuit 24. In this embodiment, the current-voltage control circuit 23 includes a driving voltage generation circuit 30, a first constant voltage generation circuit 31, a second constant voltage generation circuit 32, and the reference voltage-reference current generation circuit 33.

The driving voltage generation circuit 30 generates a driving voltage by which the gate control circuit 25 is driven. The driving voltage may be set at a value obtained by subtracting a predetermined value from the power supply voltage VB. The driving voltage generation circuit 30 may generate a driving voltage of not less than 5 V to not more than 15 V which is obtained by subtracting 5 V from the power supply voltage VB. The driving voltage is input to the gate control circuit 25.

The first constant voltage generation circuit 31 generates a first constant voltage for driving the protection circuit 24. The first constant voltage generation circuit 31 may include a Zener diode and/or a regulator circuit (here, the Zener diode is included). The first constant voltage may be from not less than 1 V to not more than 5 V. The first constant voltage is input to the protection circuit 24 (specifically, a load open detection circuit 35 to be described, etc.).

The second constant voltage generation circuit 32 generates a second constant voltage for driving the protection circuit 24. The second constant voltage generation circuit 32 may include a Zener diode and/or a regulator circuit (here, the regulator circuit). The second constant voltage may be from not less than 1 V to not more than 5 V. The second constant voltage is input to the protection circuit 24 (more specifically, an overheat protection circuit 36 and a low-voltage malfunction suppression circuit 37 which are to be described later).

The reference voltage-reference current generation circuit 33 generates the reference voltage and a reference current of various types of circuits. The reference voltage may be from not less than 1 V to not more than 5 V. The reference current may be from not less than 1 mA to not more than 1 A. The reference voltage and the reference current are input to various types of circuits. In a case where various types of circuits include a comparator, the reference voltage and the reference current may be input to the comparator.

The protection circuit 24 is connected to the current-voltage control circuit 23, the gate control circuit 25, the malfunction detection circuit 29, the source of the power MISFET 9, and the source of the sensor MISFET 21. The protection circuit 24 includes an overcurrent protection circuit 34, a load open detection circuit 35, an overheat protection circuit 36, and a low-voltage malfunction suppression circuit 37.

The overcurrent protection circuit 34 protects the power MISFET 9 from an overcurrent. The overcurrent protection circuit 34 is connected to the gate control circuit 25 and the source of the sensor MISFET 21. The overcurrent protection circuit 34 may include a current monitor circuit. A signal generated by the overcurrent protection circuit 34 is input to the gate control circuit 25 (more specifically, a driving signal output circuit 40 to be described later).

The load open detection circuit 35 detects a short state or an open state of the power MISFET 9. The load open detection circuit 35 is connected to the current-voltage control circuit 23 and the source of the power MISFET 9. A signal generated by the load open detection circuit 35 is input to the current-voltage control circuit 23.

The overheat protection circuit 36 monitors a temperature of the power MISFET 9 to protect the power MISFET 9 from an excessive temperature rise. The overheat protection circuit 36 is connected to the current-voltage control circuit 23. The overheat protection circuit 36 may include a temperature sensitive device such as a diode and a thermistor. A signal generated by the overheat protection circuit 36 is input to the current-voltage control circuit 23.

The low-voltage malfunction suppression circuit 37 suppresses malfunction of the power MISFET 9 in a case where the power supply voltage VB is less than a predetermined value. The low-voltage malfunction suppression circuit 37 is connected to the current-voltage control circuit 23. A signal generated by the low-voltage malfunction suppression circuit 37 is input to the current-voltage control circuit 23.

The gate control circuit 25 controls an ON state and an OFF state of the power MISFET 9 as well as an ON state and an OFF state of the sensor MISFET 21. The gate control circuit 25 is connected to the current-voltage control circuit 23, the protection circuit 24, the gate of the power MISFET 9, and the gate of the sensor MISFET 21.

The gate control circuit 25 generates plural types of gate control signals in accordance with the number of the gate control wirings 17 in response to an electrical signal from the current-voltage control circuit 23 and an electrical signal from the protection circuit 24. The plural types of gate control signals are each input to the gate of the power MISFET 9 and the gate of the sensor MISFET 21 through the gate control wiring 17.

Specifically, the gate control circuit 25 has a function of turning on and off the MISFET 9 by controlling a plurality of gate control signals collectively in accordance with an electrical signal (input signal) applied to the input electrode 13 while, during the operation of the active clamp circuit 26, controlling the plurality of gate control signals individually so as to raise the ON resistance of the MISFET 9 (details will be given later).

More specifically, gate control circuit 25 may include an oscillation circuit 38, a charge pump circuit 39, and a driving signal output circuit 40. The oscillation circuit 38 oscillates in response to the electrical signal from the current-voltage control circuit 23 to generate a predetermined electrical signal. The electrical signal generated by the oscillation circuit 38 is input to the charge pump circuit 39. The charge pump circuit 39 boosts the electrical signal sent from the oscillation circuit 38. The electrical signal which is boosted by the charge pump circuit 39 is input to the driving signal output circuit 40.

The driving signal output circuit 40 generates plural types of gate control signals in response to the electrical signal from the charge pump circuit 39 and the electrical signal from the protection circuit 24 (more specifically, the overcurrent protection circuit 34). The plural types of gate control signals are input to the gate of the power MISFET 9 and the gate of the sensor MISFET 21 through the gate control wiring 17. The sensor MISFET 21 and the power MISFET 9 are controlled at the same time by the gate control circuit 25.

The active clamp circuit 26 protects the power MISFET 9 from a counter electromotive force. The active clamp circuit 26 is connected to the drain electrode 11, the gate of the power MISFET 9, and the gate of the sensor MISFET 21. The active clamp circuit 26 may include a plurality of diodes.

The active clamp circuit 26 may include a plurality of diodes which are connected to each other in a forward-biased manner. The active clamp circuit 26 may include a plurality of diodes which are connected to each other in a reverse-biased manner. The active clamp circuit 26 may include a plurality of diodes which are connected to each other in a forward-biased manner and a plurality of diodes which are connected to each other in a reverse-biased manner.

The plurality of diodes may include a pn junction diode or a Zener diode, or a pn junction diode and a Zener diode. The active clamp circuit 26 may include a plurality of Zener diodes which are connected to each other in a biased manner. The active clamp circuit 26 may include a Zener diode and a pn junction diode which are connected to each other in a reverse-biased manner.

The current detecting circuit 27 detects a current which flows through the power MISFET 9 and the sensor MISFET 21. The current detecting circuit 27 is connected to the protection circuit 24, the malfunction detection circuit 29, the source of the power MISFET 9, and the source of the sensor MISFET 21. The current detecting circuit 27 generates a current detection signal in response to an electrical signal generated by the power MISFET 9 and an electrical signal generated by the sensor MISFET 21. The current detection signal is input to the malfunction detection circuit 29.

The power-supply reverse connection protection circuit 28 protects the current-voltage control circuit 23, the power MISFET 9, etc., from a reverse voltage when a power supply is connected reversely. The power-supply reverse connection protection circuit 28 is connected to the reference voltage electrode 14 and the current-voltage control circuit 23.

The malfunction detection circuit 29 monitors a voltage of the protection circuit 24. The malfunction detection circuit 29 is connected to the current-voltage control circuit 23, the protection circuit 24, and the current detecting circuit 27. In a case where malfunction (change in voltage, etc.) occurs in any of the overcurrent protection circuit 34, the load open detection circuit 35, the overheat protection circuit 36, and the low-voltage malfunction suppression circuit 37, the malfunction detection circuit 29 generates and outputs to the outside a malfunction detecting signal in accordance with a voltage of the protection circuit 24.

More specifically, the malfunction detection circuit 29 includes a first multiplexer circuit 41 and a second multiplexer circuit 42. The first multiplexer circuit 41 includes two input portions, one output portion, and one selection control input portion. The protection circuit 24 and the current detecting circuit 27 are each connected to the input portions of the first multiplexer circuit 41. The second multiplexer circuit 42 is connected to the output portion of the first multiplexer circuit 41. The current-voltage control circuit 23 is connected to the selection control input portion of the first multiplexer circuit 41.

The first multiplexer circuit 41 generates a malfunction detecting signal in response to an electrical signal from the current-voltage control circuit 23, a voltage detecting signal from the protection circuit 24, and a current detection signal from the current detecting circuit 27. The malfunction detecting signal generated by the first multiplexer circuit 41 is input to the second multiplexer circuit 42.

The second multiplexer circuit 42 includes two input portions and one output portion. The output portion of the second multiplexer circuit 42 and the ENABLE electrode 15 are each connected to the input portions of the second multiplexer circuit 42. The SENSE electrode 16 is connected to the output portion of the second multiplexer circuit 42.

In a case where the MCU is connected to the ENABLE electrode 15 and the resistor is connected to the SENSE electrode 16, an ON signal is input from the MCU to the ENABLE electrode 15 and a malfunction detecting signal is taken out from the SENSE electrode 16. The malfunction detecting signal is converted to an electrical signal by the resistor connected to the SENSE electrode 16. A malfunction state of the semiconductor device 1 is detected based in the electrical signal.

Figure 3:
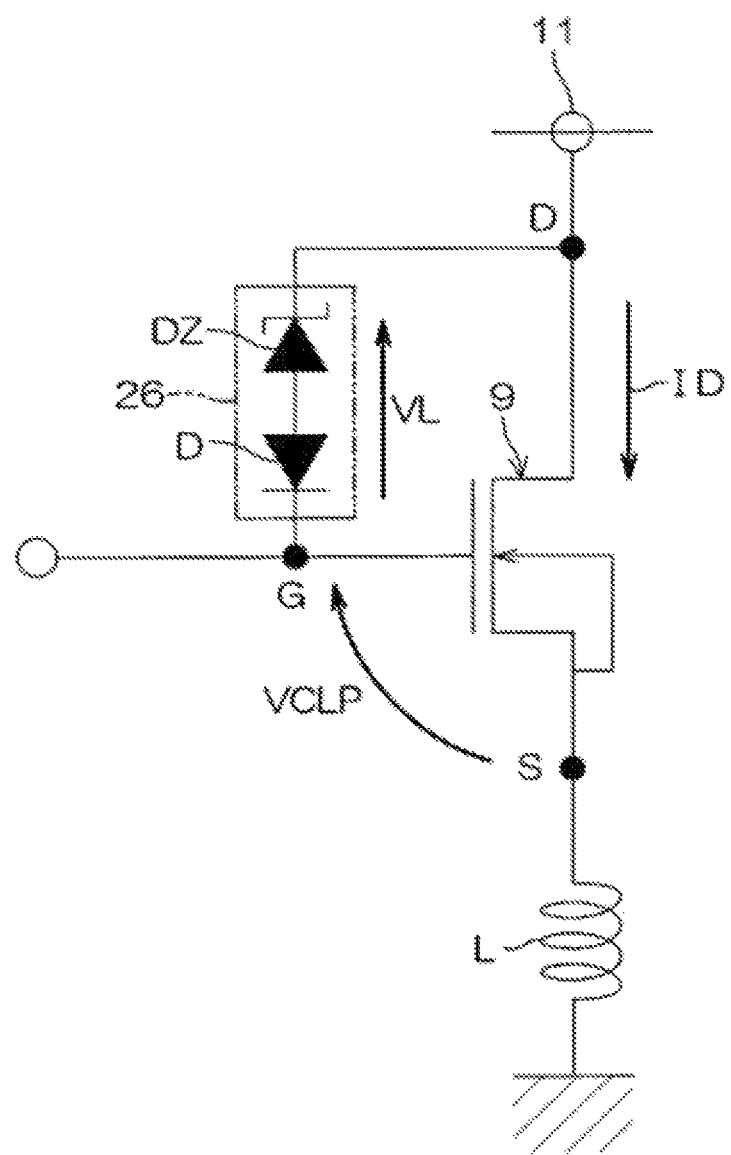
FIG. 3 is a circuit diagram illustrating normal operation and active clamp operation of a semiconductor device.
Figure 4:
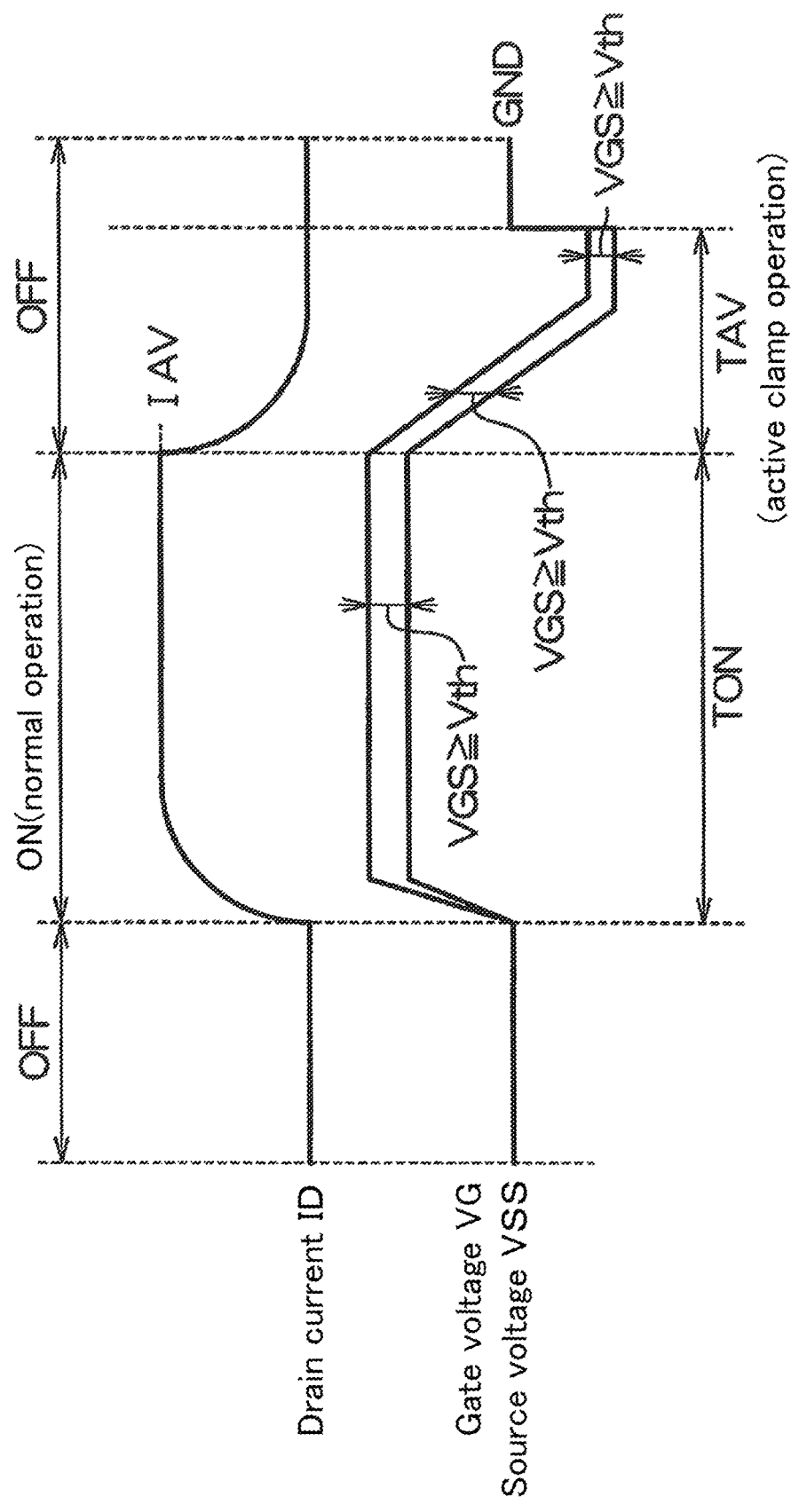
FIG. 4 is a diagram showing the waveforms of relevant electrical signals.

FIG. 3 is a circuit diagram for describing active clamp operation of the semiconductor device 1 shown in FIG. 1. FIG. 4 is a waveform chart of a main electrical signal of the circuit diagram shown in FIG. 3.

Here, a circuit example in which an inductive load L is connected to the power MISFET 9 is used to describe normal operation and active clamp operation of the semiconductor device 1. A device which uses a winding (coil) such as a solenoid, a motor, a transformer, a relay, etc., is shown as an example of the inductive load L. The inductive load L is also called an L load.

With reference to FIG. 3, the source of the power MISFET 9 is electrically connected to the inductive load L. The drain of the power MISFET 9 is electrically connected to the drain electrode 11. The gate and the drain of the power MISFET 9 are connected to the active clamp circuit 26. In this circuit example, the active clamp circuit 26 includes the m number (m is a natural number) of Zener diodes DZ and the n number (n is a natural number) of pn junction diodes D. The pn junction diode D is connected to the Zener diode DZ in a reverse-biased manner.

With reference to FIG. 3 and FIG. 4, when an ON signal Von is input to the gate of the power MISFET 9 in an OFF state, the power MISFET 9 is switched from the OFF state to an ON state (normal operation). The ON signal Von has a voltage equal to or larger than the gate threshold voltage Vth (Vth≤Von). The power MISFET 9 is kept in the ON state only for a predetermined in time TON.

When the power MISFET 9 is switched to the ON state, a drain current ID starts to flow from the drain of the power MISFET 9 to the source. The drain current ID increases from zero to a predetermined value and saturates. The inductive load L allows an inductive energy to accumulate due to an increase in the drain current ID.

When an OFF signal Voff is input to the gate of the power MISFET 9, the power MISFET 9 is switched from the ON state to the OFF state. The OFF signal Voff has a voltage less than the gate threshold voltage Vth (Voff<Vth). The OFF signal Voff may be the reference voltage (for example, the ground voltage).

In transition when the power MISFET 9 is switched from the ON state to the OFF state, an inductive energy of the inductive load L is applied as a counter electromotive force to the power MISFET 9. Thereby, the power MISFET 9 is shifted to an active clamp state (active clamp operation). When the power MISFET 9 is shifted to the active clamp state, a source voltage VSS sharply lowers to a negative voltage less than the reference voltage (ground voltage).

At this time, the source voltage VSS is limited to a voltage equal to or more than a voltage obtained by subtracting a limit voltage VL and a clamp ON voltage VCLP from a power supply voltage VB due to operation of the active clamp circuit 26 (VSS≥VB−VL−VCLP).

In other words, when the power MISFET 9 is shifted to an active clamp state, a drain voltage VDS between the drain and the source of the power MISFET 9 sharply rises to a clamp voltage VDSSCL. The clamp voltage VDSSCL is limited to a voltage equal to or less than a voltage obtained by adding a clamp ON voltage VCLP and a limit voltage VL (VDS≤VCLP+VL) by the power MISFET 9 and the active clamp circuit 26.

In this embodiment, the limit voltage VL is a sum of a voltage between terminals VZ of a Zener diode DZ and a voltage between terminals VF of a pn junction diode in the active clamp circuit 26 (VL=m·VZ+n·VF).

The clamp ON voltage VCLP is a positive voltage (that is, a gate voltage VGS) applied between the gate and the source of the power MISFET 9. The clamp ON voltage VCLP is equal to or more than the gate threshold voltage Vth (Vth≤VCLP). Therefore, the power MISFET 9 keeps the ON state in an active clamp state.

In a case where the clamp voltage VDSSCL exceeds a maximum rated drain voltage VDSS (VDSS<VDSSCL), the power MISFET 9 reaches breakdown. The power MISFET 9 is designed such that the clamp voltage VDSSCL becomes equal to or less than the maximum rated drain voltage VDSS (VDSSCL≤VDSS).

In a case where the clamp voltage VDSSCL is equal to or less than the maximum rated drain voltage VDSS (VDSSCL≤VDSS), a drain current ID continuously flows from the drain of the power MISFET 9 to the source thereof, and an inductive energy of the inductive load L is consumed (absorbed) in the power MISFET 9.

Through an active clamp time TAV, the drain current ID is reduced to zero from a peak value IAV which is immediately before the power MISFET 9 becomes the OFF state. Thereby, the gate voltage VGS becomes the reference voltage (for example, the ground voltage) and the power MISFET 9 is switched from the ON state to the OFF state.

The active clamp capability Eac of the power MISFET 9 is defined by the capability of the power MISFET 9 in the active clamp operation. More specifically, the active clamp capability Eac is defined by the capability of the power MISFET 9 with respect to the counter electromotive force caused by the inductive energy of the inductive load L in transition when the power MISFET 9 is switched from the ON state to the OFF state.

More specifically, the active clamp capability Eac is defined by the capability of the power MISFET 9 with respect to the energy caused by the clamp voltage VDSSCL. For example, the active clamp capability Eac is expressed by a formula of Eac=(VL+VCLP)×ID×TAV by using the limit voltage VL, the clamp ON voltage VCLP, the drain current ID, and the active clamp time TAV.

Figure 5:
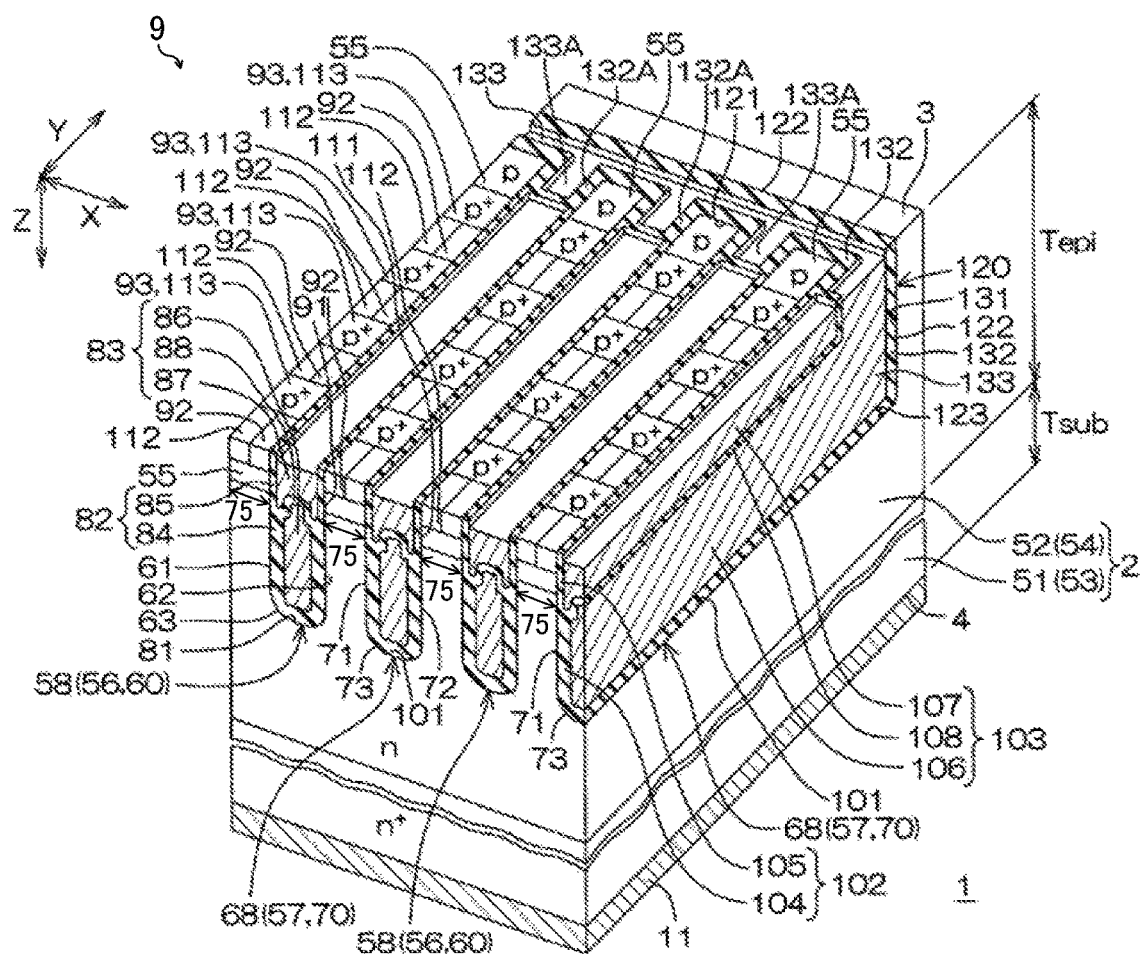
FIG. 5 is a sectional perspective view of a region V in FIG. 1.

FIG. 5 is a sectional perspective view of a region V shown in FIG. 1. In FIG. 5, for the sake of convenience, the structures above the first main surface 3 (i.e., the source electrode 12, the gate control wiring 17, the interlayer insulation layer, and the like) are omitted from illustration.

In the illustrated semiconductor device 1 in this embodiment, the semiconductor layer 2 has a laminated structure including an n+-type semiconductor substrate 51 and an n-type epitaxial layer 52. The second main surface 4 of the semiconductor layer 2 is formed by the semiconductor substrate 51. The first main surface 3 of the semiconductor layer 2 is formed by the epitaxial layer 52. The side surfaces 5A to 5D of the semiconductor layer 2 are formed by the semiconductor substrate 51 and the epitaxial layer 52.

The epitaxial layer 52 has an n-type impurity concentration less than an n-type impurity concentration of the semiconductor substrate 51. The n-type impurity concentration of the semiconductor substrate 51 may be from not less than 1×1018 cm-3 to not more than 1×1020 cm-3. The n-type impurity concentration of the epitaxial layer 52 may be from not less than 1×1015 cm-3 to not more than 1×1018 cm-3.

The epitaxial layer 52 has a thickness Tepi less than a thickness Tsub of the semiconductor substrate 51 (Tepi<Tsub). The thickness Tsub may be from not less than 50 µm to not more than 450 µm. The thickness Tsub may be from not less than 50 µm to not more than 150 µm, from not less than 150 µm to not more than 250 µm, from not less than 250 µm to not more than 350 µm, or from not less than 350 µm to not more than 450 µm.

By reducing the thickness Tsub, it becomes possible to reduce a resistance value. The thickness Tsub is adjusted by grinding. In this case, the second main surface 4 of the semiconductor layer 2 may be a ground surface having a grinding mark.

The thickness Tepi of the epitaxial layer 52 is preferably not more than 1/10 of the thickness Tsub. The thickness Tepi may be from not less than 5 µm to not more than 20 µm. The thickness Tepi may be from not less than 5 µm to not more than 10 µm, from not less than 10 µm to not more than 15 µm, or from not less than 15 µm to not more than 20 µm. The thickness Tepi is preferably from not less than 5 µm to not more than 15 µm.

The semiconductor substrate 51 is formed in the second main surface 4 side of the semiconductor layer 2 as a drain region 53. The epitaxial layer 52 is formed in a surface layer portion of the first main surface 3 of the semiconductor layer 2 as a drift region 54 (drain drift region). A bottom portion of the drift region 54 is formed by a boundary between the semiconductor substrate 51 and the epitaxial layer 52. Hereinafter, the epitaxial layer 52 is referred to as the drift region 54.

A p-type body region 55 is formed in a surface layer portion of the first main surface 3 of the semiconductor layer 2 in the output region 6. The body region 55 is a region which serves as a base of the power MISFET 9. A p-type impurity concentration of the body region 55 may be from not less than $1×10^{16}$ cm-3 to not more than $1×10^{18}$ cm-3.

The body region 55 is formed in a surface layer portion of the drift region 54. A bottom portion of the body region 55 is formed in a region in the first main surface 3 side with respect to the bottom portion of the drift region 54. A thickness of the body region 55 may be from not less than 0.5 µm to not more than 2 µm. The thickness of the body region 55 may be from not less than 0.5 µm to not more than 1 µm, from not less than 1 µm to not more than 1.5 µm, or from not less than 1.5 µm to not more than 2 µm.

The power MISFET 9 includes a first MISFET 56 (first transistor) and a second MISFET 57 (second transistor). The first MISFET 56 is electrically separated from the second MISFET 57 and controlled independently. The second MISFET 57 is electrically separated from the first MISFET 56 and controlled independently.

That is, the power MISFET 9 is configured such as to be driven when the first MISFET 56 and the second MISFET 57 are both in ON states (Full-ON control). The power MISFET 9 is also configured such as to be driven when the first MISFET 56 is in an ON state while the second MISFET 57 is in an OFF state (first Half-ON control). Further, the power MISFET 9 is configured such as to be driven when the first MISFET 56 is in an OFF state while the second MISFET 57 is in an ON state (second Half-ON control).

In the case of Full-ON control, the power MISFET 9 is driven in a state where all current paths are opened. Therefore, an ON resistance inside the semiconductor layer 2 is relatively reduced. On the other hand, in the case of first Half-ON control or second Half-ON control, the power MISFET 9 is driven in a state where some of the current paths are blocked. Therefore, the ON resistance inside the semiconductor layer 2 is relatively increased.

Specifically, the first MISFET 56 includes a plurality of first FET (Field Effect Transistor) structures 58. The plurality of first FET structures 58 are arrayed at intervals along the first direction X, and extend in a band shape along the second direction Y, respectively, in plan view. The plurality of first FET structures 58 are formed in a stripe shape as a whole in plan view.

In FIG. 5, a region of the first FET structure 58 at one end portion side is shown, while a region of the first FET structure 58 at the other end portion side is omitted. The region of the first FET structure 58 at the other end portion side is substantially similar in structure to the region of the first FET structure 58 at one end portion side. Hereinafter, the structure of the region of the first FET structure 58 at one end portion side is described as an example, and a description of the structure of the region of the first FET structure 58 at the other end portion side shall be omitted.

In this embodiment, each of the first FET structures 58 includes a first trench gate structure 60. A first width WT1 of the first trench gate structure 60 may be from not less than 0.5 µm to not more than 5 µm. The first width WT1 is a width in a direction (first direction X) orthogonal to a direction (second direction Y) in which the first trench gate structure 60 extends.

The first width WT1 may be from not less than 0.5 µm to not more than 1 µm, from not less than 1 µm to not more than 1.5 µm, from not less than 1.5 µm to not more than 2 µm, from not less than 2 µm to not more than 2.5 µm, from not less than 2.5 µm to not more than 3 µm, from not less than 3 µm to not more than 3.5 µm, from not less than 3.5 µm to not more than 4 µm, from not less than 4 µm to not more than 4.5 µm, or from not less than 4.5 µm to not more than 5 µm. The first width WT1 is preferably from not less than 0.8 µm to not more than 1.2 µm.

The first trench gate structure 60 penetrates through the body region 55 and reaches the drift region 54. A first depth DT1 of the first trench gate structure 60 may be from not less than 1 µm to not more than 10 µm. The first depth DT1 may be from not less than 1 µm to not more than 2 µm, from not less than 2 µm to not more than 4 µm, from not less than 4 µm to not more than 6 µm, from not less than 6 µm to not more than 8 µm, or from not less than 8 µm to not more than 10 µm. The first depth DT1 is preferably from not less than 2 µm to not more than 6 µm.

The first trench gate structure 60 includes a first side wall 61 on one side, a second side wall 62 on the other side, and a bottom wall 63 which connects the first side wall 61 and the second side wall 62. Hereinafter, the first side wall 61, the second side wall 62, and the bottom wall 63 may be collectively referred to as "an inner wall" or "an outer wall."

An absolute value of an angle (taper angel) formed between the first side wall 61 and the first main surface 3 inside the semiconductor layer 2 may be in excess of 90° and not more than 95° (for example, approximately 91°). The absolute value of an angle (taper angel) formed between the second side wall 62 and the first main surface 3 inside the semiconductor layer 2 may be in excess of 90° and not more than 95° (for example, approximately 91°). The first trench gate structure 60 may be formed in a shape (tapered shape) that the first width WT1 is made narrow from the first main surface 3 side to the bottom wall 63 side in sectional view.

The bottom wall 63 of the first trench gate structure 60 is positioned in a region at the first main surface 3 side with respect to the bottom portion of the drift region 54. The bottom wall 63 of the first trench gate structure 60 is formed in a convex curved shape (U letter shape) toward the bottom portion of the drift region 54.

The bottom wall 63 of the first trench gate structure 60 is positioned in a region at the first main surface 3 side with a first interval IT1 of not less than 1 µm to not more than 10 µm from the bottom portion of the drift region 54. The first interval IT1 may be from not less than 1 µm to not more than 2 µm, from not less than 2 µm to not more than 4 µm, from not less than 4 µm to not more than 6 µm, from not less than 6 µm to not more than 8 µm, or from not less than 8 µm to not more than 10 µm. The first interval IT1 is preferably from not less than 1 µm to not more than 5 µm.

In this embodiment, the second MISFET 57 includes a plurality of second FET structures 68. The plurality of second FET structures 68 are arrayed at intervals along the first direction X, and extend in a band shape along the second direction Y, respectively, in plan view.

The plurality of second FET structures 68 extend along the same direction as the plurality of first FET structures 58. The plurality of second FET structures 68 are formed in a stripe shape as a whole in plan view. In this embodiment, the plurality of second FET structures 68 are arrayed alternately with the plurality of first FET structures 58 in a manner that one first FET structure 58 is held therebetween.

In FIG. 5, a region of the second FET structure 68 at one end portion side is shown in the drawing, while a region of the second FET structure 68 at the other end portion side is omitted. The region of the second FET structure 68 at the other end portion side is substantially similar in structure to the region of the second FET structure 68 t one end portion side. Hereinafter, the structure of the region of the second FET structure 68 at one end portion side is described as an example, and a description of the structure of the region of the second FET structure 68 at the other end portion side shall be omitted.

In this embodiment, each of the second FET structures 68 includes a second trench gate structure 70. A second width WT2 of the second trench gate structure 70 may be from not less than 0.5 μm to not more than 5 μm. The second width WT2 is a width in a direction (first direction X) orthogonal to a direction (second direction Y) in which the second trench gate structure 70 extends.

The second width WT2 may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The second width WT2 is preferably from not less than 0.8 μm to not more than 1.2 μm.

The second width WT2 of the second trench gate structure 70 may be equal to or more than the first width WT1 of the first trench gate structure 60 (WT1≤WT2). The second width WT2 may be equal to or less than the first width WT1 (WT1≥WT2). It is preferable that the second width WT2 is equal to the first width WT1 (WT1=WT2).

The second trench gate structure 70 penetrates through the body region 55 and reaches the drift region 54. A second depth DT2 of the second trench gate structure 70 may be from not less than 1 μm to not more than 10 μm. The second depth DT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second depth DT2 is preferably from not less than 2 μm to not more than 6 μm.

The second depth DT2 of the second trench gate structure 70 may be equal to or more than the first depth DT1 of the first trench gate structure 60 (DT1≤DT2). The second depth DT2 may be equal to or less than the first depth DT1 (DT1≥DT2). It is preferable that the second depth DT2 is equal to the first depth DT1 (DT1=DT2).

The second trench gate structure 70 includes a first side wall 71 on one side, a second side wall 72 on the other side, and a bottom wall 73 which connects the first side wall 71 and the second side wall 72. Hereinafter, the first side wall 71, the second side wall 72, and the bottom wall 73 may be collectively referred to as "an inner wall" or "an outer wall."

An absolute value of an angle (taper angel) formed between the first side wall 71 and the first main surface 3 inside the semiconductor layer 2 may be in excess of 90° and not more than 95° (for example, approximately 91°). The absolute value of an angle (taper angel) formed between the second side wall 72 and the first main surface 3 inside the semiconductor layer 2 may be in excess of 90° and not more than 95° (for example, approximately 91°). The second trench gate structure 70 may be formed in a shape (tapered shape) that the second width WT2 is made narrow from the first main surface 3 side to the bottom wall 73 side in sectional view.

The bottom wall 73 of the second trench gate structure 70 is positioned in a region at the first main surface 3 side with respect to the bottom portion of the drift region 54. The bottom wall 73 of the second trench gate structure 70 is formed in a convex curved shape (U letter shape) toward the bottom portion of the drift region 54.

The bottom wall 73 of the second trench gate structure 70 is positioned in a region at the first main surface 3 side with a second interval IT2 of not less than 1 μm to not more than 10 μm from the bottom portion of the drift region 54. The second interval IT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second interval IT2 is preferably from not less than 1 μm to not more than 5 μm.

Cell regions 75 are each defined in regions between the plurality of first trench gate structures 60 and the plurality of second trench gate structures 70. The plurality of cell regions 75 are arrayed at intervals along the first direction X, and extend in a band shape along the second direction Y, respectively, in plan view. The plurality of cell regions 75 extend along the same direction as the first trench gate structure 60 and the second trench gate structure 70. The plurality of cell regions 75 are formed in a stripe shape as a whole in plan view.

A first depletion layer spreads inside the drift region 54 from an outer wall of the first trench gate structure 60. The first depletion layer spreads toward a direction along the first main surface 3 from the outer wall of the first trench gate structure 60 and toward the normal direction Z. Similarly, a second depletion layer spreads inside the drift region 54 from the outer wall of the second trench gate structure 70. The second depletion layer spreads toward a direction along the first main surface 3 from the outer wall of the second trench gate structure 70 and toward the normal direction Z.

The second trench gate structure 70 is arrayed at an interval from the first trench gate structure 60 in a manner that the second depletion layer overlaps with the first depletion layer. That is, the second depletion layer overlaps with the first depletion layer in a region at the first main surface 3 side with respect to the bottom wall 73 of the second trench gate structure 70 in the cell region 75. According to the above described structure, since it is possible to suppress an electric field concentration on the first trench gate structure 60 and the second trench gate structure 70, it is possible to suppress a reduction in breakdown voltage.

It is preferable that the second depletion layer overlaps with the first depletion layer in a region at the bottom portion side of the drift region 54 with respect to the bottom wall 73 of the second trench gate structure 70. According to the above described structure, since it is possible to suppress an electric field concentration in the bottom wall 63 of the first trench gate structure 60 and the bottom wall 73 of the second trench gate structure 70, it is possible to appropriately suppress a reduction in breakdown voltage.

A pitch PS between a side wall of the first trench gate structure 60 and that of the second trench gate structure 70 may be from not less than 0.2 μm to not more than 2 μm. The pitch PS is a distance in a direction (first direction X) orthogonal to a direction (second direction Y) in which the first trench gate structure 60 and the second trench gate structure 70 extend between the first side wall 61 (second side wall 62) of the first trench gate structure 60 and the second side wall 72 (first side wall 71) of the second trench gate structure 70.

The pitch PS may be from not less than 0.2 μm to not more than 0.4 μm, from not less than 0.4 μm to not more than 0.6 μm, from not less than 0.6 μm to not more than 0.8 μm, from not less than 0.8 μm to not more than 1.0 μm, from not less than 1.0 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2.0 μm. The pitch PS is preferably from not less than 0.3 μm to not more than 1.5 μm.

A pitch PC between a central portion of the first trench gate structure 60 and that of the second trench gate structure 70 may be from not less than 1 μm to not more than 7 μm. The pitch PC is a distance in a direction (the first direction X) orthogonal to a direction (the second direction Y) in which the first trench gate structure 60 and the second trench gate structure 70 extend between the central portion of the first trench gate structure 60 and the central portion of the second trench gate structure 70.

The pitch PC may be from not less than 1 μm to not more than 2 μm, from not less than 2 μm to not more than 3 μm, from not less than 3 μm to not more than 4 μm, from not less than 4 μm to not more than 5 μm, from not less than 5 μm to not more than 6 μm, or from not less than 6 μm to not more than 7 μm. The pitch PC is preferably from not less than 1 μm to not more than 3 μm.

The first trench gate structure 60 includes a first gate trench 81, a first insulation layer 82, and a first electrode 83. The first gate trench 81 is formed by digging down the first main surface 3 toward the second main surface 4 side.

The first gate trench 81 defines the first side wall 61, the second side wall 62, and the bottom wall 63 of the first trench gate structure 60. Hereinafter, the first side wall 61, the second side wall 62, and the bottom wall 63 of the first trench gate structure 60 shall also be referred to as the first side wall 61, the second side wall 62, and the bottom wall 63 of the first gate trench 81.

The first insulation layer 82 is formed in a film shape along an inner wall of the first gate trench 81. The first insulation layer 82 defines a concave space inside the first gate trench 81. A portion which covers the bottom wall 63 of the first gate trench 81 in the first insulation layer 82 is conformally formed along the bottom wall 63 of the first gate trench 81. Thereby, the first insulation layer 82 defines a U letter space which is recessed in a U letter shape inside the first gate trench 81.

The first insulation layer 82 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The first insulation layer 82 may have a laminated structure including an SiN layer and an $SiO_2$ layer formed in that order from the semiconductor layer 2 side. The first insulation layer 82 may have a laminated structure including an $SiO_2$ layer and an SiN layer formed in that order from the semiconductor layer 2 side. The first insulation layer 82 has a single layer structure composed of an $SiO_2$ layer or an SiN layer. In this embodiment, the first insulation layer 82 has a single layer structure composed of an $SiO_2$ layer.

The first insulation layer 82 includes a first bottom-side insulation layer 84 and a first opening-side insulation layer 85 which are formed in this order from the bottom wall 63 side of the first gate trench 81 to the first main surface 3 side.

The first bottom-side insulation layer 84 covers the inner wall of the first gate trench 81 at the bottom wall 63 side. More specifically, the first bottom-side insulation layer 84 covers the inner wall of the first gate trench 81 at the bottom wall 63 side with respect to the bottom portion of the body region 55. The first bottom-side insulation layer 84 defines a U letter space at the bottom wall 63 side of the first gate trench 81. The first bottom-side insulation layer 84 has a smooth inner wall surface which defines the U letter space. The first bottom-side insulation layer 84 is in contact with the drift region 54. A part of the first bottom-side insulation layer 84 may be in contact with the body region 55.

The first opening-side insulation layer 85 covers the inner wall of the first gate trench 81 at the opening side. More specifically, the first opening-side insulation layer 85 covers the first side wall 61 and the second side wall 62 of the first gate trench 81 in a region at the opening side of the first gate trench 81 with respect to the bottom portion of the body region 55. The first opening-side insulation layer 85 is in contact with the body region 55. A part of the first opening-side insulation layer 85 may be in contact with the drift region 54.

The first bottom-side insulation layer 84 has a first thickness T1. The first opening-side insulation layer 85 has a second thickness T2 less than the first thickness T1 (T2<T1). The first thickness T1 is a thickness of the first bottom-side insulation layer 84 along a normal direction of the inner wall of the first gate trench 81. The second thickness T2 is a thickness of the first opening-side insulation layer 85 along the normal direction of the inner wall of the first gate trench 81.

A first ratio T1/WT1 of the first thickness T1 with respect to the first width WT1 of the first gate trench 81 may be from not less than 0.1 to not more than 0.4. Instead, the first ratio T1/WT1 may be from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The first ratio T1/WT1 is preferably from not less than 0.25 to not more than 0.35.

The first thickness T1 of the first bottom-side insulation layer 84 may be from not less than 1500 Å to not more than 4000 Å. The first thickness T1 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The first thickness T1 is preferably from not less than 1800 Å to not more than 3500 Å.

The first thickness T1 may be adjusted to a range from not less than 4000 Å to not more than 12000 Å according to the first width WT1 of the first gate trench 81. The first thickness T1 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the first bottom-side insulation layer 84, it becomes possible to increase a withstand voltage of the semiconductor device 1.

The second thickness T2 of the first opening-side insulation layer 85 may be from not less than $\frac{1}{100}$ to not more than $\frac{1}{10}$ of the first thickness T1 of the first bottom-side insulation layer 84. The second thickness T2 may be from not less than 100 Å to not more than 500 Å. The second thickness T2 may be from not less than 100 Å to not more than 200 Å, from not less than 200 Å to not more than 300 Å, from not less than 300 Å to not more than 400 Å, or from not less than 400 Å to not more than 500 Å. The second thickness T2 is preferably from not less than 200 Å to not more than 400 Å.

The first bottom-side insulation layer 84 is formed in a manner that the first thickness T1 is reduced from a part which covers the first side wall 61 and the second side wall 62 of the first gate trench 81 toward a part which covers the bottom wall 63 of the first gate trench 81.

The part which covers the bottom wall 63 of the first gate trench 81 in the first bottom-side insulation layer 84 is smaller in thickness than the part which covers the first side wall 61 and the second side wall 62 of the first gate trench 81 in the first bottom-side insulation layer 84. An opening width of the U letter space in the bottom wall side defined by the first bottom-side insulation layer 84 is expanded by an amount of a reduction in the first thickness T1. Thereby, the U letter space is suppressed from being tapered. The above-described U letter space is formed, for example, by an etching method (for example, a wet etching method) to the inner wall of the first bottom-side insulation layer 84.

The first electrode 83 is embedded in the first gate trench 81 across the first insulation layer 82. First gate control signals (first control signals) including an ON signal Von and an OFF signal Voff are applied to the first electrode 83. In this embodiment, the first electrode 83 has an insulated separation type split electrode structure including a first bottom-side electrode 86, a first opening-side electrode 87, and a first intermediate insulation layer 88.

The first bottom-side electrode 86 is embedded in the bottom wall 63 side of the first gate trench 81 across the first insulation layer 82. More specifically, the first bottom-side electrode 86 is embedded in the bottom wall 63 side of the first gate trench 81 across the first bottom-side insulation layer 84. The first bottom-side electrode 86 faces the drift region 54 across the first bottom-side insulation layer 84. A part of the first bottom-side electrode 86 may face the body region 55 across the first bottom-side insulation layer 84.

The first bottom-side electrode 86 defines an inverted concave recess in sectional view between the first bottom-side insulation layer 84 and the first opening-side insulation layer 85 at the opening side of the first gate trench 81. According to this structure, since it is possible to suppress a local electric field concentration on the first bottom-side electrode 86, it is possible to suppress a reduction in breakdown voltage. In particular, by embedding the first bottom-side electrode 86 into an expanded U letter space of the first bottom-side insulation layer 84, it becomes possible to appropriately suppress the first bottom-side electrode 86 from being tapered from an upper end portion to a lower end portion. Thereby, it is possible to appropriately suppress a local electric field concentration on the lower end portion of the first bottom-side electrode 86.

The first bottom-side electrode 86 may include at least any one of conductive polysilicon, tungsten, aluminum, copper, an aluminum alloy, and a copper alloy. In this embodiment, the first bottom-side electrode 86 includes conductive polysilicon. The conductive polysilicon may include an n-type impurity or a p-type impurity. The conductive polysilicon preferably includes an n-type impurity.

The first opening-side electrode 87 is embedded into the opening side of the first gate trench 81 across the first insulation layer 82. More specifically, the first opening-side electrode 87 is embedded in the inverted concave recess defined at the opening side of the first gate trench 81 across the first opening-side insulation layer 85. The first opening-side electrode 87 faces the body region 55 across the first opening-side insulation layer 85. A part of the first opening-side electrode 87 may face the drift region 54 across the first opening-side insulation layer 85.

The first opening-side electrode 87 may include at least any one of conductive polysilicon, tungsten, aluminum, copper, an aluminum alloy, and a copper alloy. The first opening-side electrode 87 preferably includes the same type of conductive material as the first bottom-side electrode 86. In this embodiment, the first opening-side electrode 87 includes conductive polysilicon. The conductive polysilicon may include an n-type impurity or a p-type impurity. The conductive polysilicon preferably includes an n-type impurity.

The first intermediate insulation layer 88 is interposed between the first bottom-side electrode 86 and the first opening-side electrode 87 to electrically insulate the first bottom-side electrode 86 and the first opening-side electrode 87. More specifically, the first intermediate insulation layer 88 covers the first bottom-side electrode 86 exposed from the first bottom-side insulation layer 84 in a region between the first bottom-side electrode 86 and the first opening-side electrode 87. The first intermediate insulation layer 88 covers the upper end portion (more specifically, protruded portion) of the first bottom-side electrode 86. The first intermediate insulation layer 88 is continuous with the first insulation layer 82 (first bottom-side insulation layer 84).

The first intermediate insulation layer 88 has a third thickness T3. The third thickness T3 is less than the first thickness T1 of the first bottom-side insulation layer 84 (T3<T1). The third thickness T3 may be from not less than 1/100 to not more than 1/10 of the thickness T1. The third thickness T3 may be from not less than 100 Å to not more than 500 Å. The third thickness T3 may be from not less than 100 Å to not more than 200 Å, from not less than 200 Å to not more than 300 Å, from not less than 300 Å to not more than 400 Å, or from not less than 400 Å to not more than 500 Å. The third thickness T3 is preferably from not less than 200 Å to not more than 400 Å.

The first intermediate insulation layer 88 includes at least any one of silicon oxide (SiO2), silicon nitride (SiN), aluminum oxide (Al2O3), zirconium oxide (ZrO2), and tantalum oxide (Ta2O3). In this embodiment, the first intermediate insulation layer 88 has a single layer structure composed of an SiO2 layer.

In this embodiment, an exposed portion which is exposed from the first gate trench 81 in the first opening-side electrode 87 is positioned at the bottom wall 63 side of the first gate trench 81 with respect to the first main surface 3. The exposed portion of the first opening-side electrode 87 is formed in a curved shape toward the bottom wall 63 of the first gate trench 81.

The exposed portion of the first opening-side electrode 87 is covered by a first cap insulation layer formed in a film shape. The first cap insulation layer is continuous with the first insulation layer 82 (first opening-side insulation layer 85) inside the first gate trench 81. The first cap insulation layer may include silicon oxide (SiO2).

Each of the first FET structures 58 further includes a p-type first channel region 91 (first channel). The first channel region 91 is formed in a region which faces the first electrode 83 (first opening-side electrode 87) across the first insulation layer 82 (first opening-side insulation layer 85) in the body region 55.

The first channel region 91 is formed along the first side wall 61 or the second side wall 62 of the first trench gate structure 60, or along the first side wall 61 and the second side wall 62 thereof. In this embodiment, the first channel region 91 is formed along the first side wall 61 and the second side wall 62 of the first trench gate structure 60.

Each of the first FET structure 58 further includes an n+-type first source region 92 formed in a surface layer portion of the body region 55. The first source region 92 demarcates the first channel region 91 with the drift region 54 inside the body region 55. An n-type impurity concentration of the first source region 92 is in excess of an n-type impurity concentration of the drift region 54. The n-type impurity concentration of the first source region 92 may be from not less than $1\times10^{19}$ cm-3 to not more than $1\times10^{21}$ cm-3.

In this embodiment, each of the first FET structures 58 includes the plurality of first source regions 92. The plurality of first source regions 92 are formed in the surface layer portion of the body region 55 at an interval along the first trench gate structure 60. More specifically, the plurality of first source regions 92 are formed along the first side wall 61 or the second side wall 62 of the first trench gate structure 60, or along the first side wall 61 and the second side wall 62 thereof. In this embodiment, the plurality of first source regions 92 are formed at an interval along the first side wall 61 and the second side wall 62 of the first trench gate structure 60.

The bottom portions of the plurality of first source regions 92 are positioned in a region at the first main surface 3 side with respect to the bottom portion of the body region 55. Thereby, the plurality of first source regions 92 face the first electrode 83 (first opening-side electrode 87) across the first insulation layer 82 (first opening-side insulation layer 85). Thus, the first channel region 91 of the first MISFET 56 is formed in a region which is held between the plurality of first source regions 92 and the drift region 54 in the body region 55.

Each of the first FET structures 58 further includes a p+-type first contact region 93 formed in the surface layer portion of the body region 55. A p-type impurity concentration of the first contact region 93 is in excess of a p-type impurity concentration of the body region 55. The p-type impurity concentration of the first contact region 93 may be, for example, from not less than $1\times10^{19}$ cm-3 to not more than $1\times10^{21}$ cm-3.

In this embodiment, each of the first FET structure 58 includes a plurality of first contact regions 93. The plurality of first contact regions 93 are formed in the surface layer portion of the body region 55 at an interval along the first trench gate structure 60. More specifically, the plurality of first contact regions 93 are formed along the first side wall 61 or the second side wall 62 of the first trench gate structure 60, or along the first side wall 61 and the second side wall 62 thereof.

In this embodiment, the plurality of first contact regions 93 are formed at an interval along the first side wall 61 and the second side wall 62 of the first trench gate structure 60. More specifically, the plurality of first contact regions 93 are formed in the surface layer portion of the body region 55 in a manner that the plurality of first contact regions 93 are alternately arrayed with the plurality of first source regions 92. The bottom portions of the plurality of first contact regions 93 are positioned in a region at the first main surface 3 side with respect to the bottom portion of the body region 55.

The second trench gate structure 70 includes a second gate trench 101, a second insulation layer 102, and a second electrode 103. The second gate trench 101 is formed by digging down the first main surface 3 toward the second main surface 4 side.

The second gate trench 101 defines the first side wall 71, the second side wall 72, and the bottom wall 73 of the second trench gate structure 70. Hereinafter, the first side wall 71, the second side wall 72, and the bottom wall 73 of the second trench gate structure 70 are also referred to as the first side wall 71, the second side wall 72, and the bottom wall 73 of the second gate trench 101.

The second insulation layer 102 is formed in a film shape along an inner wall of the second gate trench 101. The second insulation layer 102 defines a concave space inside the second gate trench 101. A part which covers the bottom wall 73 of the second gate trench 101 in the second insulation layer 102 is conformally formed along the bottom wall 73 of the second gate trench 101. Thereby, the second insulation layer 102 defines a U letter space recessed in a U letter shape inside the second gate trench 101.

The second insulation layer 102 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The second insulation layer 102 may have a laminated structure including an SiN layer and an $SiO_2$ layer formed in that order from the semiconductor layer 2 side. The second insulation layer 102 may have a laminated structure including an $SiO_2$ layer and an SiN layer formed in that order from the semiconductor layer 2 side. The second insulation layer 102 has a single layer structure composed of an $SiO_2$ layer or an SiN layer. In this embodiment, the second insulation layer 102 has a single layer structure composed of an $SiO_2$ layer.

The second insulation layer 102 includes a second bottom-side insulation layer 104 and a second opening-side insulation layer 105 which are formed in this order from the bottom wall 73 side of the second gate trench 101 to the first main surface 3 side.

The second bottom-side insulation layer 104 covers the inner wall of the second gate trench 101 at the bottom wall 73 side. More specifically, the second bottom-side insulation layer 104 covers the inner wall of the second gate trench 101 at the bottom wall 73 side with respect to the bottom portion of the body region 55. The second bottom-side insulation layer 104 defines a U letter space at the bottom wall 73 side of the second gate trench 101. The second bottom-side insulation layer 104 has a smooth inner wall surface which defines the U letter space. The second bottom-side insulation layer 104 is in contact with the drift region 54. A part of the second bottom-side insulation layer 104 may be in contact with the body region 55.

The second opening-side insulation layer 105 covers the inner wall of the second gate trench 101 at the opening side. More specifically, the second opening-side insulation layer 105 covers the first side wall 71 and the second side wall 72 of the second gate trench 101 in a region of the second gate trench 101 at the opening side with respect to the bottom portion of the body region 55. The second opening-side insulation layer 105 is in contact with the body region 55. A part of the second opening-side insulation layer 105 may be in contact with the drift region 54.

The second bottom-side insulation layer 104 has a fourth thickness T4. The second opening-side insulation layer 105 has a fifth thickness T5 less than the fourth thickness T4 (T5<T4). The fourth thickness T4 is a thickness of the second bottom-side insulation layer 104 along a normal direction of the inner wall of the second gate trench 101. The fifth thickness T5 is a thickness of the second opening-side insulation layer 105 along the normal direction of the inner wall of the second gate trench 101.

A second ratio T4/WT2 of the fourth thickness T4 with respect to the second width WT2 of the second gate trench 101, may be from not less than 0.1 to not more than 0.4. The second ratio T4/WT2 may be, for example, from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The second ratio T4/WT2 is preferably from not less than 0.25 to not more than 0.35.

The second ratio T4/WT2 may be equal to or less than the first ratio T1/WT1 (T4/WT2≤T1/WT1). The second ratio T4/WT2 may be equal to or more than the first ratio T1/WT1 (T4/WT2≥T1/WT1). Instead, the second ratio T4/WT2 may be equal to the first ratio T1/WT1 (T4/WT2=T1/WT1).

The fourth thickness T4 of the second bottom-side insulation layer 104 may be from not less than 1500 Å to not more than 4000 Å. The fourth thickness T4 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The fourth thickness T4 is preferably from not less than 1800 Å to not more than 3500 Å.

The fourth thickness T4 may be from not less than 4000 Å to not more than 12000 Å according to the second width WT2 of the second gate trench 101. The fourth thickness T4 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the second bottom-side insulation layer 104, it becomes possible to increase a withstand voltage of the semiconductor device 1.

The fourth thickness T4 may be equal to or less than the first thickness T1 (T4≤T1). The fourth thickness T4 may be equal to or more than the first thickness T1 (T4≥T1). The fourth thickness T4 may be equal to the first thickness T1 (T4=T1).

The fifth thickness T5 of the second opening-side insulation layer 105 is less than the fourth thickness T4 of the second bottom-side insulation layer 104 (T5<T4). The fifth thickness T5 may be from not less than 1/100 of the fourth thickness T4 to not more than 1/10. The fifth thickness T5 may be from not less than 100 Å to not more than 500 Å. The fifth thickness T5 may be from not less than 100 Å to not more than 200 Å, from not less than 200 Å to not more than 300 Å, from not less than 300 Å to not more than 400 Å, or from not less than 400 Å to not more than 500 Å. The fifth thickness T5 is preferably from not less than 200 Å to not more than 400 Å.

The fifth thickness T5 may be equal to or less than the second thickness T2 (T5≤T2). The fifth thickness T5 may be equal to or more than the second thickness T2 (T5≥T2). The fifth thickness T5 may be equal to the second thickness T2 (T5=T2).

The second bottom-side insulation layer 104 is formed in a manner that the fourth thickness T4 is reduced from a part which covers the first side wall 71 and the second side wall 72 of the second gate trench 101 toward a part which covers the bottom wall 73 of the second gate trench 101.

The part which covers the bottom wall 73 of the second gate trench 101 in the second bottom-side insulation layer 104 is smaller in thickness than the part which covers the first side wall 71 and the second side wall 72 of the second gate trench 101 in the second bottom-side insulation layer 104. An opening width of the U letter space defined by the second bottom-side insulation layer 104 at the bottom wall side is expanded by an amount of a reduction in the fourth thickness T4. Thereby, the U letter space is suppressed from being tapered. The above-described U letter space is formed, for example, by an etching method (for example, a wet etching method) to the inner wall of the second bottom-side insulation layer 104.

The second electrode 103 is embedded in the second gate trench 101 across the second insulation layer 102. Second gate control signals (second control signals) including an ON signal Von and an OFF signal Voff are applied to the second electrode 103.

In this embodiment, the second electrode 103 has an insulated-separation type split electrode structure including a second bottom-side electrode 106, a second opening-side electrode 107, and a second intermediate insulation layer 108. In this embodiment, the second bottom-side electrode 106 is electrically connected to the first bottom-side electrode 86. The second opening-side electrode 107 is electrically insulated from the first opening-side electrode 87.

The second bottom-side electrode 106 is embedded in the bottom wall 73 side of the second gate trench 101 across the second insulation layer 102. More specifically, the second bottom-side electrode 106 is embedded in the bottom wall 73 side of the second gate trench 101 across the second bottom-side insulation layer 104. The second bottom-side electrode 106 faces the drift region 54 across the second bottom-side insulation layer 104. A part of the second bottom-side electrode 106 may face the body region 55 across the second bottom-side insulation layer 104.

The second bottom-side electrode 106 defines an inverted concave recess in sectional view between the second bottom-side insulation layer 104 and the second opening-side insulation layer 105 at the opening side of the second gate trench 101. According to this structure, since it is possible to suppress a local electric field concentration on the second bottom-side electrode 106, it is possible to suppress a reduction in breakdown voltage. In particular, by embedding the second bottom-side electrode 106 into the U letter space expanded by the second bottom-side insulation layer 104, it becomes possible to appropriately suppress the second bottom-side electrode 106 from being tapered from an upper end portion to a lower end portion. Thereby, it is possible to appropriately suppress a local electric field concentration at the lower end portion of the second bottom-side electrode 106.

The second bottom-side electrode 106 may include at least any one of conductive polysilicon, tungsten, aluminum, copper, an aluminum alloy, and a copper alloy. In this embodiment, the second bottom-side electrode 106 includes conductive polysilicon. The conductive polysilicon may include an n-type impurity or a p-type impurity. The conductive polysilicon preferably includes an n-type impurity.

The second opening-side electrode 107 is embedded in the opening side of the second gate trench 101 across the second insulation layer 102. More specifically, the second opening-side electrode 107 is embedded in the inverted concave recess defined at the opening side of the second gate trench 101 across the second opening-side insulation layer 105. The second opening-side electrode 107 faces the body region 55 across the second opening-side insulation layer 105. A part of the second opening-side electrode 107 may face the drift region 54 across the second opening-side insulation layer 105.

The second opening-side electrode 107 may include at least any one of conductive polysilicon, tungsten, aluminum, copper, an aluminum alloy, and a copper alloy. The second opening-side electrode 107 preferably includes the same type of conductive material as the second bottom-side electrode 106. In this embodiment, the second opening-side electrode 107 includes conductive polysilicon. The conductive polysilicon may include an n-type impurity or a p-type impurity. The conductive polysilicon preferably includes an n-type impurity.

The second intermediate insulation layer 108 is interposed between the second bottom-side electrode 106 and the second opening-side electrode 107 to electrically insulate the second bottom-side electrode 106 and the second opening-side electrode 107. More specifically, the second intermediate insulation layer 108 covers the second bottom-side electrode 106 exposed from the second bottom-side insulation layer 104 in a region between the second bottom-side electrode 106 and the second opening-side electrode 107. The second intermediate insulation layer 108 covers the upper end portion of the second bottom-side electrode 106 (more specifically, a protruded portion). The second intermediate insulation layer 108 is continuous with the second insulation layer 102 (second bottom-side insulation layer 104).

The second intermediate insulation layer 108 has a sixth thickness T6. The sixth thickness T6 is less than the fourth thickness T4 of the second bottom-side insulation layer 104 (T6<T4). The sixth thickness T6 may be from not less than ¹⁄₁₀₀ of the fourth thickness T4 to not more than ¹⁄₁₀. The sixth thickness T6 may be from not less than 100 Å to not more than 500 Å. The sixth thickness T6 may be from not less than 100 Å to not more than 200 Å, from not less than 200 Å to not more than 300 Å, from not less than 300 Å to not more than 400 Å, or from not less than 400 Å to not more than 500 Å. The sixth thickness T6 is preferably from not less than 200 Å to not more than 400 Å.

The sixth thickness T6 may be equal to or less than the third thickness T3 (T6≤T3). The sixth thickness T6 may be equal to or more than the third thickness T3 (T6≥T3). The sixth thickness T6 may be equal to the third thickness T3 (T6=T3).

The second intermediate insulation layer 108 includes at least any one of silicon oxide (SiO2), silicon nitride (SiN), aluminum oxide (Al2O3), zirconium oxide (ZrO2), and tantalum oxide (Ta2O3). In this embodiment, the second intermediate insulation layer 108 has a single layer structure composed of an SiO2 layer.

In this embodiment, an exposed portion which is exposed from the second gate trench 101 in the second opening-side electrode 107 is positioned at the bottom wall 73 side of the second gate trench 101 with respect to the first main surface 3. The exposed portion of the second opening-side electrode 107 is formed in a curved shape toward the bottom wall 73 of the second gate trench 101.

The exposed portion of the second opening-side electrode 107 is covered by a second cap insulation layer formed in a film shape. The second cap insulation layer is continuous with the second insulation layer 102 (second opening-side insulation layer 105) inside the second gate trench 101. The second cap insulation layer may include silicon oxide (SiO2).

Each of the second FET structures 68 further includes a p-type second channel region 111 (second channel). More specifically, the second channel region 111 is formed in a region which faces the second electrode 103 (second opening-side electrode 107) across the second insulation layer 102 (second opening-side insulation layer 105) in the body region 55.

More specifically, the second channel region 111 is formed along the first side wall 71 or the second side wall 72 of the second trench gate structure 70, or along the first side wall 71 and the second side wall 72 thereof. In this embodiment, the second channel region 111 is formed along the first side wall 71 and the second side wall 72 of the second trench gate structure 70.

Each of the second FET structures 68 further includes an n+-type second source region 112 formed in the surface layer portion of the body region 55. The second source region 112 demarcates the second channel region 111 with the drift region 54 inside the body region 55.

An n-type impurity concentration of the second source region 112 is in excess of an n-type impurity concentration of the drift region 54. The n-type impurity concentration of the second source region 112 may be from not less than 1×10¹⁹ cm-3 to not more than 1×10²¹ cm-3. It is preferable that the n-type impurity concentration of the second source region 112 is equal to the n-type impurity concentration of the first source region 92.

In this embodiment, each of the second FET structures 68 includes the plurality of second source regions 112. The plurality of second source regions 112 are formed in the surface layer portion of the body region 55 at an interval along the second trench gate structure 70. Specifically, the plurality of second source regions 112 are formed along the first side wall 71 or the second side wall 72 of the second trench gate structure 70, or along the first side wall 71 and the second side wall 72 thereof. In this embodiment, the plurality of second source regions 112 are formed at an interval along the first side wall 71 and the second side wall 72 of the second trench gate structure 70.

In this embodiment, each of the second source regions 112 faces each of the first source regions 92 along the first direction X. Each of the second source regions 112 is integrally formed with each of the first source regions 92. FIG. 5 show that the first source region 92 and the second source region 112 are distinguished from each other by a boundary line. However, in actuality, there is no clear boundary line in a region between the first source region 92 and the second source region 112.

The second source regions 112 may be each formed such as to be shifted from each of the first source regions 92 in the second direction Y such as not to face some of or all of the first source regions 92 along the first direction X. That is, the plurality of first source regions 92 and the plurality of second source regions 112 may be arrayed in a staggered manner in plan view.

The bottom portions of the plurality of second source regions 112 are positioned in a region at the first main surface 3 side with respect to the bottom portion of the body region 55. Thereby, the plurality of second source regions 112 face the second electrode 103 (second opening-side electrode 107) across the second insulation layer 102 (second opening-side insulation layer 105). Thus, the second channel region 111 of the second MISFET 57 is formed in a region held between the plurality of second source regions 112 and the drift region 54 in the body region 55.

Each of the second FET structures 68 further includes a p+-type second contact region 113 formed in the surface layer portion of the body region 55. A p-type impurity concentration of the second contact region 113 is in excess of a p-type impurity concentration of the body region 55. The p-type impurity concentration of the second contact region 113 may be from not less than 1×1019 cm-3 to not more than 1×1021 cm-3. It is preferable that the p-type impurity concentration of the second contact region 113 is equal to the p-type impurity concentration of the first contact region 93.

In this embodiment, each of the second FET structures 68 includes the plurality of second contact regions 113. The plurality of second contact regions 113 are formed in the surface layer portion of the body region 55 at an interval along the second trench gate structure 70. More specifically, the plurality of second contact regions 113 are formed along the first side wall 71 or the second side wall 72 of the second trench gate structure 70, or along the first side wall 71 and the second side wall 72 thereof. The bottom portions of the plurality of second contact regions 113 are positioned in a region in the first main surface 3 side with respect to the bottom portion of the body region 55.

In this embodiment, the plurality of second contact regions 113 are formed at an interval along the first side wall 71 and the second side wall 72 of the second trench gate structure 70. More specifically, the plurality of second contact regions 113 are formed in the surface layer portion of the body region 55 in a manner that the plurality of second contact regions 113 are arrayed alternately with the plurality of second source regions 112.

With reference to FIG. 5, in this embodiment, each of the second contact regions 113 faces each of the first contact regions 93 along the first direction X. Each of the second contact regions 113 is integrally formed with each of the first contact regions 93.

In FIG. 5, in order to distinguish the first contact region 93 and the second contact region 113 from the first source region 92 and the second source region 112, the first contact region 93 and the second contact region 113 are collectively indicated by a reference sign of "p+."

Each of the second contact regions 113 may be formed such as to be shifted from each of the first contact regions 93 in the second direction Y such as not to face some of or all of the first contact regions 93 along the first direction X. That is, the plurality of first contact regions 93 and the plurality of second contact regions 113 may be arrayed in a staggered manner in plan view.

With reference to FIG. 5, in this embodiment, the body region 55 is exposed from a region between one end portion of the first trench gate structure 60 and one end portion of the second trench gate structure 70 in the first main surface 3 of the semiconductor layer 2. Any of the first source region 92, the first contact region 93, the second source region 112, and the second contact region 113 is not formed in the region held between one end portion of the first trench gate structure 60 and one end portion of the second trench gate structure 70 in the first main surface 3.

Similarly, although not shown in the drawings, in this embodiment, the body region 55 is exposed from a region between the other end portion of the first trench gate structure 60 and the other end portion of the second trench gate structure 70 in the first main surface 3 of the semiconductor layer 2. Any of the first source region 92, the first contact region 93, the second source region 112, and the second contact region 113 is not formed in the region held between the other end portion of the first trench gate structure 60 and the other end portion of the second trench gate structure 70.

With reference to FIG. 5, a plurality of (Here, two) trench contact structures 120 are formed in the first main surface 3 of the semiconductor layer 2. The plurality of trench contact structures 120 include a trench contact structure 120 at one side and a trench contact structure 120 at the other side.

The trench contact structure 120 at one side is positioned in a region at the side of one end portion of the first trench gate structure 60 and one end portion of the second trench gate structure 70. The trench contact structure 120 at the other side is positioned in a region at the side of the other end portion of the first trench gate structure 60 and at the other end portion of the second trench gate structure 70.

The trench contact structure 120 at the other side is substantially similar in structure to the trench contact structure 120 at one side. Hereinafter, a structure of the trench contact structure 120 at one side shall be described as an example, and a specific description of a structure of the trench contact structure 120 at the other side shall be omitted.

The trench contact structure 120 is connected to one end portion of the first trench gate structure 60 and one end portion of the second trench gate structure 70. In this embodiment, the trench contact structure 120 extends in a band shape along the first direction X in plan view.

A width WTC of the trench contact structure 120 may be from not less than 0.5 µm to not more than 5 µm. The width WTC is a width in a direction (second direction Y) orthogonal to a direction (first direction X) in which the trench contact structure 120 extends.

The width WTC may be from not less than 0.5 µm to not more than 1 µm, from not less than 1 µm to not more than 1.5 µm, from not less than 1.5 µm to not more than 2 µm, from not less than 2 µm to not more than 2.5 µm, from not less than 2.5 µm to not more than 3 µm, from not less than 3 µm to not more than 3.5 µm, from not less than 3.5 µm to not more than 4 µm, from not less than 4 µm to not more than 4.5 µm, or from not less than 4.5 µm to not more than 5 µm. The width WTC is preferably from not less than 0.8 µm to not more than 1.2 µm.

It is preferable that the width WTC is equal to the first width WT1 of the first trench gate structure 60 (WTC=WT1). It is preferable that the width WTC is equal to the second width WT2 of the second trench gate structure 70 (WTC=WT2).

The trench contact structure 120 penetrates through the body region 55 and reaches the drift region 54. A depth DTC of the trench contact structure 120 may be from not less than 1 µm to not more than 10 µm. The depth DTC may be from may be from not less than 1 µm to not more than 2 µm, from not less than 2 µm to not more than 4 µm, from not less than 4 µm to not more than 6 µm, from not less than 6 µm to not more than 8 µm, or from not less than 8 µm to not more than 10 µm. The depth DTC is preferably from not less than 2 µm to not more than 6 µm.

It is preferable that the depth DTC is equal to the first depth DT1 of the first trench gate structure 60 (DTC=DT1). It is preferable that the depth DTC is equal to the second depth DT2 of the second trench gate structure 70 (DTC=DT2).

The trench contact structure 120 includes a first side wall 121 on one side, a second side wall 122 on the other side, and a bottom wall 123 which connects the first side wall 121 and the second side wall 122. Hereinafter, the first side wall 121, the second side wall 122, and the bottom wall 123 may be collectively referred to as "an inner wall." The first side wall 121 is a connection surface which is connected to the first trench gate structure 60 and the second trench gate structure 70.

The first side wall 121, the second side wall 122, and the bottom wall 123 are positioned inside the drift region 54. The first side wall 121 and the second side wall 122 extend along the normal direction Z. The first side wall 121 and the second side wall 122 may be formed perpendicularly to the first main surface 3.

An absolute value of an angle (taper angel) formed between the first side wall 121 and the first main surface 3 inside semiconductor layer 2 may be in excess of 90° and not more than 95° (for example, approximately 91°). The absolute value of an angle (taper angel) formed between the second side wall 122 and the first main surface 3 inside the semiconductor layer 2 may be in excess of 90° and not more than 95° (for example, approximately 91°). The trench contact structure 120 may be formed in a shape (tapered shape) that the width WTC is made narrow from the first main surface 3 side of the semiconductor layer 2 to the bottom wall 123 side in sectional view.

The bottom wall 123 is positioned in a region at the first main surface 3 side with respect to the bottom portion of the drift region 54. The bottom wall 123 is formed in a convex curved shape toward the bottom portion of the drift region 54. The bottom wall 123 is positioned in a region at the first main surface 3 side with an interval ITC of not less than 1 μm to not more than 10 μm from the bottom portion of the drift region 54. The interval ITC may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The interval ITC is preferably from not less than 1 μm to not more than 5 μm.

It is preferable that the interval ITC is equal to the first interval IT1 of the first trench gate structure 60 (ITC=IT1). It is preferable that the interval ITC is equal to the second interval IT2 of the second trench gate structure 70 (ITC=IT2).

The trench contact structure 120 includes a contact trench 131, a contact insulation layer 132, and a contact electrode 133. The contact trench 131 is formed by digging down the first main surface 3 of the semiconductor layer 2 toward the second main surface 4 side.

The contact trench 131 defines the first side wall 121, the second side wall 122, and the bottom wall 123 of the trench contact structure 120. Hereinafter, the first side wall 121, the second side wall 122, and the bottom wall 123 of the trench contact structure 120 are also referred to as the first side wall 121, the second side wall 122, and the bottom wall 123 of the contact trench 131.

The first side wall 121 of the contact trench 131 communicates with the first side wall 61 and the second side wall 62 of the first gate trench 81. The first side wall 121 of the contact trench 131 communicates with the first side wall 71 and the second side wall 72 of the second gate trench 101. The contact trench 131 forms one trench with the first gate trench 81 and the second gate trench 101.

The contact insulation layer 132 is formed in a film shape along an inner wall of the contact trench 131. The contact insulation layer 132 defines a concave space inside the contact trench 131. A part which covers the bottom wall 123 of the contact trench 131 in the contact insulation layer 132 is conformally formed along the bottom wall 123 of the contact trench 131.

The contact insulation layer 132 defines a U letter space recessed in a U letter shape inside the contact trench 131 in a manner similar to the first bottom-side insulation layer 84 (second bottom-side insulation layer 104). That is, the contact insulation layer 132 defines a U letter space in which a region of the contact trench 131 at the bottom wall 123 side is expanded and suppressed from being tapered. The above-described U letter space is formed, for example, by an etching method (for example, a wet etching method) to the inner wall of the contact insulation layer 132.

The contact insulation layer 132 has a seventh thickness T7. The seventh thickness T7 may be from not less than 1500 Å to not more than 4000 Å. The seventh thickness T7 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The seventh thickness T7 is preferably from not less than 1800 Å to not more than 3500 Å.

The seventh thickness T7 may be from not less than 4000 Å to not more than 12000 Å according to the width WTC of the trench contact structure 120. The seventh thickness T7 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the contact insulation layer 132, it becomes possible to increase a withstand voltage of the semiconductor device 1.

It is preferable that the seventh thickness T7 is equal to the first thickness T1 of the first bottom-side insulation layer 84 (T7=T1). It is preferable that the seventh thickness T7 is equal to the fourth thickness T4 of the second bottom-side insulation layer 104 (T7=T4).

The contact insulation layer 132 includes at least any one of silicon oxide (SiO2), silicon nitride (SiN), aluminum oxide (Al2O3), zirconium oxide (ZrO2), and tantalum oxide (Ta2O3).

The contact insulation layer 132 may have a laminated structure including an SiN layer and an SiO2 layer formed in that order from the semiconductor layer 2 side. The contact insulation layer 132 may have a laminated structure including an SiO2 layer and an SiN layer formed in that order from the semiconductor layer 2 side. The contact insulation layer 132 has a single layer structure composed of an SiO2 layer or an SiN layer. In this embodiment, the contact insulation layer 132 has a single layer structure composed of an SiO2 layer. The contact insulation layer 132 is preferably composed of the same insulating material as the first insulation layer 82 (second insulation layer 102).

The contact insulation layer 132 is integrally formed with the first insulation layer 82 in a communication portion between the first gate trench 81 and the contact trench 131. The contact insulation layer 132 is integrally formed with the second insulation layer 102 in a communication portion between the second gate trench 101 and the contact trench 131.

In this embodiment, the contact insulation layer 132 has a lead-out insulation layer 132A which is led out to one end portion of the first gate trench 81 and one end portion of the second gate trench 101. The lead-out insulation layer 132A crosses the communication portion to cover an inner wall of one end portion of the first gate trench 81. The lead-out insulation layer 132A crosses the communication portion to cover an inner wall of one end portion of the second gate trench 101.

The lead-out insulation layer 132A is integrally formed with the first bottom-side insulation layer 84 and the first opening-side insulation layer 85 inside the first gate trench 81. The lead-out insulation layer 132A defines a U letter space together with the first bottom-side insulation layer 84 at the inner wall of one end portion of the first gate trench 81.

The lead-out insulation layer 132A is integrally formed with the second bottom-side insulation layer 104 and the second opening-side insulation layer 105 inside the second gate trench 101. The lead-out insulation layer 132A defines the U letter space together with the second bottom-side insulation layer 104 at the inner wall of one end portion of the second gate trench 101.

The contact electrode 133 is embedded in the contact trench 131 across the contact insulation layer 132. The contact electrode 133 is embedded in the contact trench 131 as an integrated member unlike the first electrode 83 and the second electrode 103. The contact electrode 133 has an upper end portion exposed from the contact trench 131 and a lower end portion in contact with the contact insulation layer 132.

The lower end portion of the contact electrode 133 is formed in a convex curved shape toward the bottom wall 123 of the contact trench 131 in a manner similar to the first bottom-side electrode 86 (second bottom-side electrode 106). More specifically, the lower end portion of the contact electrode 133 is conformally formed along the bottom wall of the U letter space defined by the contact insulation layer 132 and formed in a smooth convex curved shape toward the bottom wall 123.

According to the above-described structure, since it is possible to suppress a local electric field concentration on the contact electrode 133, it is possible to suppress a reduction in breakdown voltage. In particular, by embedding the contact electrode 133 into the expanded U letter space of the contact insulation layer 132, it becomes possible to appropriately suppress the contact electrode 133 from being tapered from the upper end portion to the lower end portion. Thereby, it is possible to appropriately suppress a local electric field concentration on the lower end portion of the contact insulation layer 132.

The contact electrode 133 is electrically connected to the first bottom-side electrode 86 at the connection portion between the first gate trench 81 and the contact trench 131. The contact electrode 133 is electrically connected to the second bottom-side electrode 106 at the connection portion between the second gate trench 101 and the contact trench 131. Thereby, the second bottom-side electrode 106 is electrically connected to the first bottom-side electrode 86.

More specifically, the contact electrode 133 has a lead-out electrode 133A which is led out to one end portion of the first gate trench 81 and one end portion of the second gate trench 101. The lead-out electrode 133A crosses the communication portion between the first gate trench 81 and the contact trench 131 and is positioned inside the first gate trench 81. The lead-out electrode 133A also crosses the communication portion between the second gate trench 101 and the contact trench 131 and is positioned inside the second gate trench 101.

The lead-out electrode 133A is embedded in a U letter space defined by the contact insulation layer 132 inside the first gate trench 81. The lead-out electrode 133A is integrally formed with the first bottom-side electrode 86 inside the first gate trench 81. Thereby, the contact electrode 133 is electrically connected to the first bottom-side electrode 86.

The first intermediate insulation layer 88 is interposed between the contact electrode 133 and the first opening-side electrode 87 inside the first gate trench 81. Thereby, the contact electrode 133 is electrically insulated from the first opening-side electrode 87 inside the first gate trench 81.

The lead-out electrode 133A is embedded in the U letter space defined by the contact insulation layer 132 inside the second gate trench 101. The lead-out electrode 133A is integrally formed with the second bottom-side electrode 106 inside the second gate trench 101. Thereby, the contact electrode 133 is electrically connected to the second bottom-side electrode 106.

The second intermediate insulation layer 108 is interposed between the contact electrode 133 and the second opening-side electrode 107 inside the second gate trench 101. Thereby, the contact electrode 133 is electrically insulated from the second opening-side electrode 107 inside the second gate trench 101.

The contact electrode 133 may include at least any one of conductive polysilicon, tungsten, aluminum, copper, an aluminum alloy, and a copper alloy. In this embodiment, the contact electrode 133 may include conductive polysilicon. The conductive polysilicon may include an n-type impurity or a p-type impurity. The conductive polysilicon preferably includes an n-type impurity. It is preferable that the contact electrode 133 includes the same conductive material as the first bottom-side electrode 86 and the second bottom-side electrode 106.

In this embodiment, an exposed portion which is exposed from the contact trench 131 in the contact electrode 133 is positioned at the bottom wall 123 side of the contact trench 131 with respect to the first main surface 3. The exposed portion of the contact electrode 133 is formed in a curved shape toward the bottom wall 123 of the contact trench 131.

The exposed portion of the contact electrode 133 is covered by a third cap insulation layer 139 which is formed in a film shape. The third cap insulation layer 139 is continuous with the contact insulation layer 132 inside the contact trench 131. The third cap insulation layer 139 may include silicon oxide (SiO2).

The gate control signal that is input from the control IC 10 to the first gate control wiring 17A (not shown) is transmitted to the first opening-side electrode 87. The gate control signal that is input from the control IC 10 to the second gate control wiring 17B (not shown) is transmitted to the second opening-side electrode 107. The gate control signal that is input from the control IC 10 to the third gate control wiring 17C (not shown) is transmitted to the first bottom-side electrode 86 and the second bottom-side electrode 106 through the contact electrode 133.

In a case where the first MISFET 56 (first trench gate structure 60) and the second MISFET 57 (second trench gate structure 70) are both controlled to be in the OFF states, the first channel region 91 and the second channel region 111 are both controlled to be in the OFF states.

In a case where the first MISFET 56 and the second MISFET 57 are both controlled to be in the ON states, the first channel region 91 and the second channel region 111 are both controlled to be in the ON states (Full-ON control).

In a case where the first MISFET 56 is controlled to be in the ON state while the second MISFET 57 is controlled to be in the OFF state, the first channel region 91 is controlled to be in the ON state and the second channel region 111 is controlled to be in the OFF state (first Half-ON control).

In a case where the first MISFET 56 is controlled to be in the OFF state while the second MISFET 57 is controlled to be in the ON state, the first channel region 91 is controlled to be in the OFF state and the second channel region 111 is controlled to be in the ON state (second Half-ON control).

As described above, in the power MISFET 9, the first MISFET 56 and the second MISFET 57 formed in one output region 6 are used to realize plural types of control including Full-ON control, first Half-ON control, and second Half-ON control.

When the first MISFET 56 is driven (that is, when the gate is controlled to be in the ON state), the ON signal Von may be applied to the first bottom-side electrode 86 and the ON signal Von may be applied to the first opening-side electrode 87. In this case, the first bottom-side electrode 86 and the first opening-side electrode 87 each function as a gate electrode.

Thereby, it is possible to suppress a voltage drop between the first bottom-side electrode 86 and the first opening-side electrode 87 and therefore it is possible to suppress an electric field concentration between the first bottom-side electrode 86 and the first opening-side electrode 87. It is also possible to reduce an ON resistance of the semiconductor layer 2 and therefore it is thereby possible to reduce electricity consumption.

When the first MISFET 56 is driven (that is, when the gate is controlled to be in the ON state), the OFF signal Voff (for example, the reference voltage) may be applied to the first bottom-side electrode 86 and the ON signal Von may be applied to the first opening-side electrode 87. In this case, while the first bottom-side electrode 86 functions as a field electrode, the first opening-side electrode 87 functions as a gate electrode. Thereby, it is possible to reduce a parasitic capacitance and therefore it is possible to improve a switching speed.

When the second MISFET 57 is driven (that is, when the gate is controlled to be in the ON state), the ON signal Von may be applied to the second bottom-side electrode 106 and the ON signal Von may be applied to the second opening-side electrode 107. In this case, the second bottom-side electrode 106 and the second opening-side electrode 107 each function as a gate electrode.

Thereby, it is possible to suppress a voltage drop between the second bottom-side electrode 106 and the second opening-side electrode 107 and therefore it is possible to suppress an electric field concentration between the second bottom-side electrode 106 and the second opening-side electrode 107. It is also possible to reduce an ON resistance of the semiconductor layer 2 and therefore it is possible to reduce electricity consumption.

When the second MISFET 57 is driven (that is, when the gate is controlled to be in the ON state), the OFF signal Voff (reference voltage) may be applied to the second bottom-side electrode 106 and the ON signal Von may be applied to the second opening-side electrode 107. In this case, while the second bottom-side electrode 106 functions as a field electrode, the second opening-side electrode 107 functions as a gate electrode. Thereby, it is possible to reduce a parasitic capacitance and therefore it is possible to improve a switching speed.

With reference to FIG. 5, the first channel region 91 is formed in each of the cell regions 75 at a first channel area S1. The first channel area S1 is defined by a total planar area of the plurality of first source regions 92 formed in each of the cell regions 75.

The first channel region 91 is formed in each of the cell regions 75 at a first channel rate R1 (first rate) (with a first channel ratio R1 (first ratio)). The first channel rate R1 is a rate which is occupied by the first channel area S1 in each of the cell regions 75 when a planar area of each cell region 75 is given as 100%.

The first channel rate R1 is adjusted to a range from not less than 0% to not more than 50%. The first channel rate R1 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The first channel rate R1 is preferably from not less than 10% to not more than 35%.

In a case where the first channel rate R1 is 50%, the first source region 92 is formed in a substantially entire region of the first side wall 61 and the second side wall 62 of the first trench gate structure 60. In this case, no first contact region 93 is formed at the first side wall 61 side or the second side wall 62 side of the first trench gate structure 60. The first channel rate R1 is preferably less than 50%.

In a case where the first channel rate R1 is 0%, no first source region 92 is formed in the first side wall 61 side or the second side wall 62 side of the first trench gate structure 60. In this case, only the body region 55 and/or the first contact region 93 are formed in the first side wall 61 side and the second side wall 62 side of the first trench gate structure 60. The first channel rate R1 is preferably in excess of 0%. In this embodiment, an example in which the first channel rate R1 is 25% is shown.

The second channel region 111 is formed in each of the cell regions 75 at a second channel area Ω. The second channel area Ω is defined by a total planar area of the plurality of second source regions 112 formed in each of the cell regions 75.

The second channel region 111 is formed in each of the cell regions 75 at a second channel rate R2 (second rate) (with a second channel ratio R2 (second ratio)). The second channel rate R2 is a rate which is occupied by the second channel area Ω in each of the cell regions 75 when a planar area of each of the cell regions 75 is given as 100%.

The second channel rate R2 is adjusted to a range from not less than 0% to not more than 50%. The second channel rate R2 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The second channel rate R2 is preferably from not less than 10% to not more than 35%.

In a case where the second channel rate R2 is 50%, the second source region 112 is formed in a substantially entire region of the first side wall 71 side and the second side wall 72 side of the second trench gate structure 70. In this case, no second contact region 113 is formed in the first side wall 71 side or the second side wall 72 side of the second trench gate structure 70. The second channel rate R2 is preferably less than 50%.

In a case where the second channel rate R2 is 0%, no second source region 112 is formed in the first side wall 71 side or the second side wall 72 side of the second trench gate structure 70. In this case, only the body region 55 and/or the second contact region 113 are formed in the first side wall 71 side and the second side wall 72 side of the second trench gate structure 70. The second channel rate R2 is preferably in excess of 0%. In this embodiment, an example in which the second channel rate R2 is 25% is shown.

As described above, the first channel region 91 and the second channel region 111 are formed in each of the cell regions 75 at a total channel rate RT (RT=R1+R2) from not less than 0% to not more than 100% (preferably in excess of 0% to less than 100%).

In this embodiment, the total channel rate RT in each of the cell regions 75 is 50%. In this embodiment, the total channel rates RT are all set at an equal value. Thus, an average channel rate RAV inside the output region 6 (unit area) is given as 50%. The average channel rate RAV is such that a sum of all of the total channel rates RT is divided by a total number of the total channel rates RT.

The total channel rate RT may be adjusted for each cell region 75. That is, the plurality of total channel rates RT different in value from each other may be each applied to each of the cell regions 75. The total channel rate RT relates to a temperature rise of the semiconductor layer 2. For example, an increase in the total channel rate RT causes a temperature rise of the semiconductor layer 2 to occur easily. On the other hand, a reduction in the total channel rate RT causes a temperature rise of the semiconductor layer 2 not to occur easily.

By using the above, the total channel rate RT may be adjusted according to a temperature distribution of the semiconductor layer 2. For example, the total channel rate RT of a region in which a temperature rise easily occurs in the semiconductor layer 2 may be made relatively small, and the total channel rate RT of a region in which a temperature rise does not easily occur in the semiconductor layer 2 may be made relatively large.

A central portion of the output region 6 can be given as an example of a region in which a temperature rise easily occurs in the semiconductor layer 2. A peripheral portion of the output region 6 can be given as an example of a region in which a temperature rise does not easily occur in the semiconductor layer 2. As a matter of course, the average channel rate RAV may be adjusted while the total channel rate RT is adjusted according to a temperature distribution of the semiconductor layer 2.

The plurality of cell regions 75 having the total channel rate RT of not less than 20% to not more than 40% (for example, 25%) may be concentrated at a region in which a temperature rise easily occurs (for example, a central portion). The plurality of cell regions 75 having the total channel rate RT of not less than 60% to not more than 80% (for example, 75%) may be concentrated at a region in which a temperature rise does not easily occur (for example, a peripheral portion). The plurality of cell regions 75 having the total channel rate RT in excess of 40% and less than 60% (for example, 50%) may be concentrated between a region in which a temperature rise easily occurs and a region in which a temperature rise does not easily occur.

Further, the total channel rate RT of not less than 20% to not more than 40%, the total channel rate RT of not less than 40% to not more than 60%, and the total channel rate RT of not less than 60% to not more than 80% may be applied to the plurality of cell regions 75 in a regular arrangement.

As an example, three types of total channel rates RT which sequentially repeat in a pattern of 25% (low) 50% (middle) 75% (high) may be applied to the plurality of cell regions 75. In this case, the average channel rate RAV may be adjusted to 50%. In the case of the above-described structure, it is possible to suppress, with a relatively simple design, a biased temperature distribution in the semiconductor layer 2 to be formed.

Figure 6:
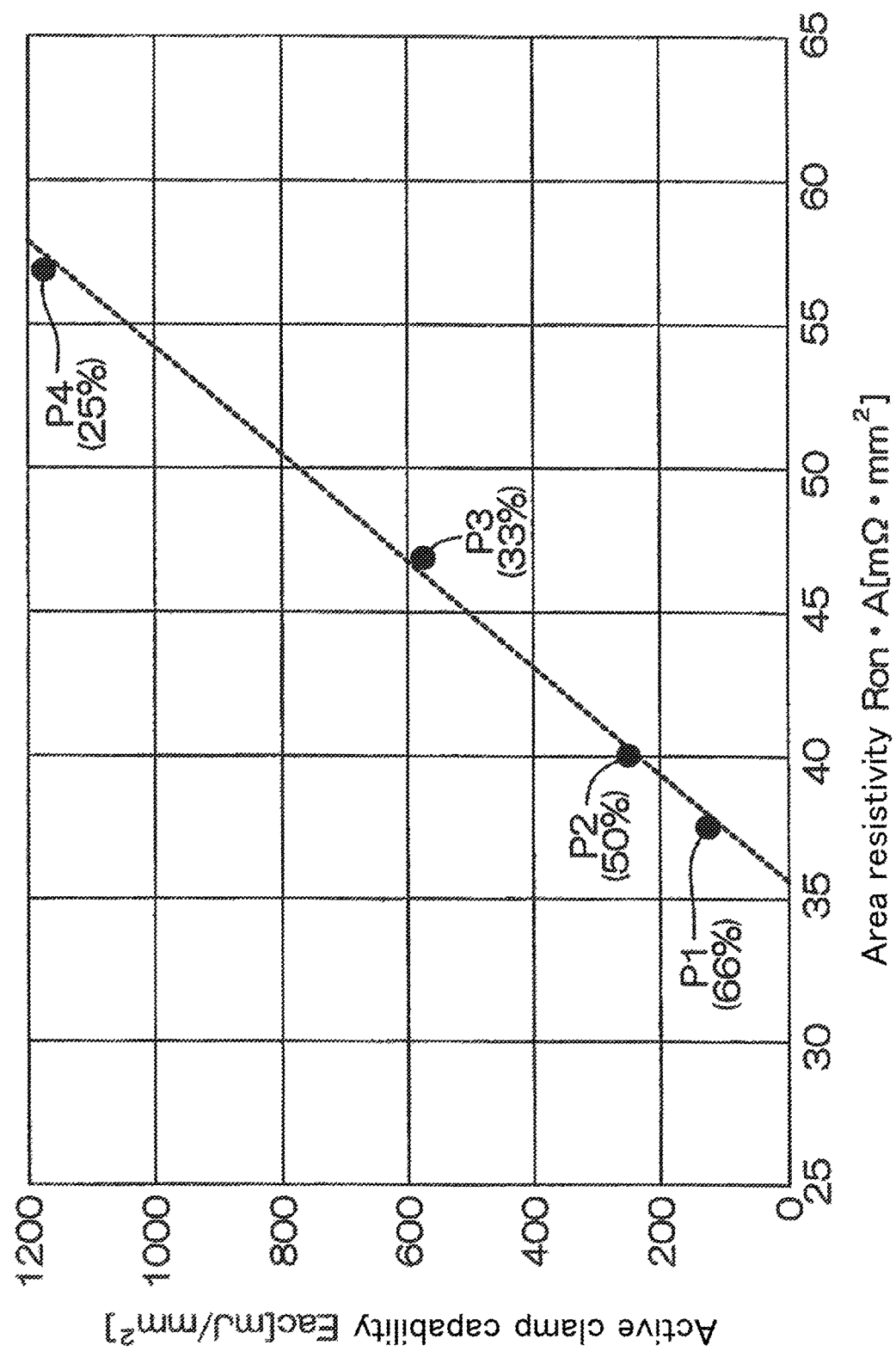
FIG. 6 is a plot of a relationship of active clamp capability versus area resistivity as actually measured.

FIG. 6 is a graph which is obtained by an actual measurement of a relationship between the active clamp capability Eac and an area resistivity Ron·A. The graph of FIG. 6 shows the characteristics where the first MISFET 56 and the second MISFET 57 are simultaneously controlled to be in the ON states and to be in the OFF states.

In FIG. 6, the vertical axis indicates the active clamp capability Eac [mJ/mm2], while the horizontal axis indicates the area resistivity Ron·A [mΩ·mm2]. As has been described in FIG. 3, the active clamp capability Eac is the capability with respect to the counter electromotive force. The area resistivity Ron·A expresses the ON resistance inside the semiconductor layer 2 in the normal operation.

A first plot point P1, a second plot point P2, a third plot point P3, and a fourth plot point P4 are shown in FIG. 6. The first plot point P1, the second plot point P2, the third plot point P3, and the fourth plot point P4 show the respective characteristics where the average channel rate RAV (that is, a total channel rate RT occupied in each of the cell regions 75) is adjusted to 66%, 50%, 33%, and 25%.

In a case where the average channel rate RAV was increased, the area resistivity Ron·A in the normal operation was reduced and the active clamp capability Eac in the active clamp operation was reduced. In contrast thereto, where the average channel rate RAV was reduced, the area resistivity Ron·A in the normal operation was increased and the active clamp capability Eac in the active clamp operation was improved.

In view of the area resistivity Ron·A, the average channel rate RAV is preferably not less than 33% (more specifically, from not less than 33% to less than 100%). In view of the active clamp capability Eac, the average channel rate RAV is preferably less than 33% (more specifically, in excess of 0% and less than 33%).

The area resistivity Ron·A was reduced due to an increase in the average channel rate RAV, and this is because of an increase in current path. On the other hand, the active clamp capability Eac was reduced due to an increase in the average channel rate RAV, and this is because of a sharp temperature rise due to the counter electromotive force.

In particular, in a case where the average channel rate RAV (total channel rate RT) is relatively large, it is more likely that a local and sharp temperature rise may occur in a region between the first trench gate structure 60 and the second trench gate structure 70 which are adjacent to each other. It is considered that the active clamp capability Eac was reduced due to this type of temperature rise.

On the other hand, the area resistivity Ron·A was increased due to a reduction in the average channel rate RAV, and this is because of shrinkage of the current path. The active clamp capability Eac was improved due to a reduction in the average channel rate RAV, and this is considered to be because the average channel rate RAV (total channel rate RT) was made relatively small and a local and sharp temperature rise was suppressed.

From the results of the graph of FIG. 6, it is found that an adjustment method based on the average channel rate RAV (total channel rate RT) has a trade-off relationship and therefore there is a difficulty in realizing an excellent area resistivity Ron·A and an excellent active clamp capability Eac at the same time independently of the trade-off relationship.

On the other hand, from the results of the graph of FIG. 6, it is found that, by making the power MISFET 9 operate such as to approach the first plot point P1 (RAV=66%) in the normal operation and operate such as to approach the fourth plot point P4 (RAV=25%) in the active clamp operation, it is possible to realize an excellent area resistivity Ron·A and an excellent active clamp capability Eac at the same time. Thus, in this semiconductor device 1, the following control is performed.

Figure 7:
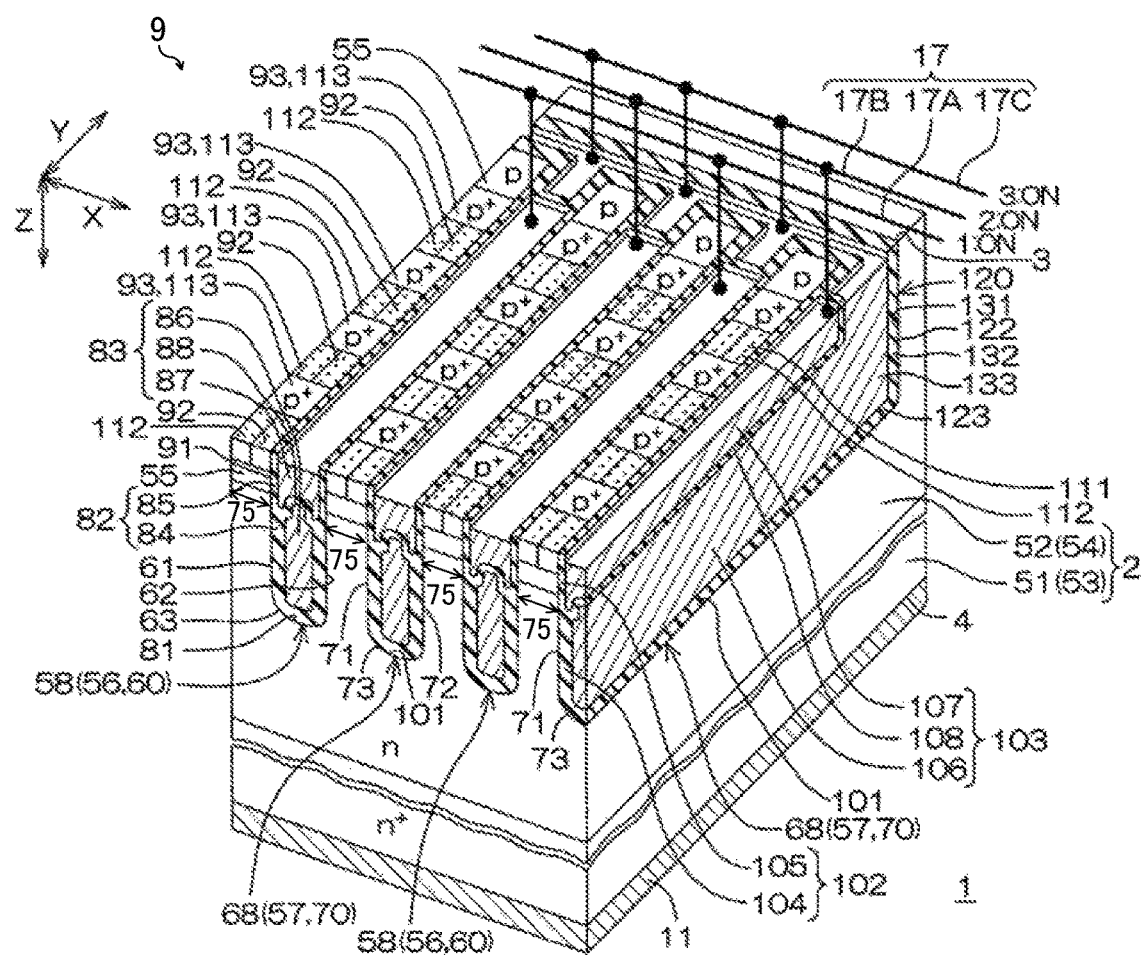
FIG. 7 is a sectional perspective view illustrating normal operation of a semiconductor device.
Figure 8:
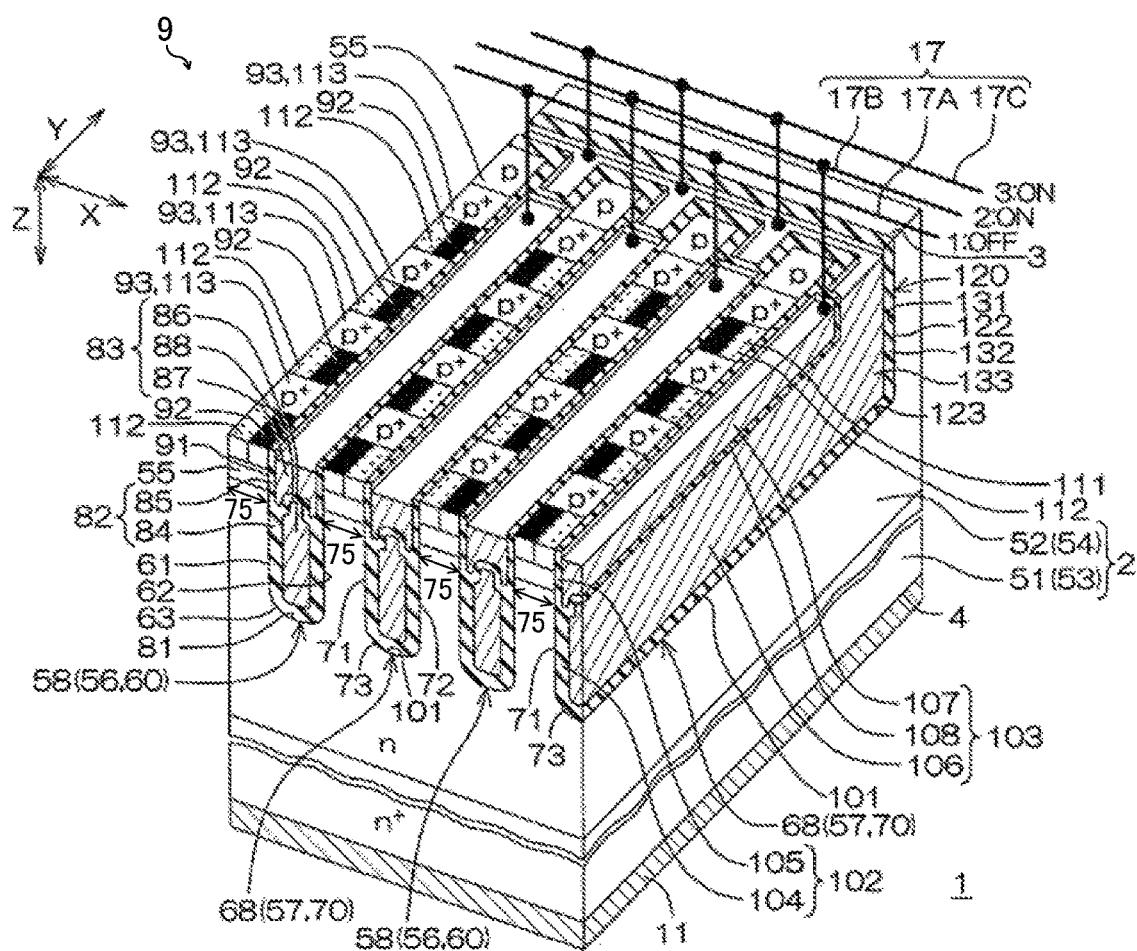
FIG. 8 is a sectional perspective view illustrating normal active clamp operation of a semiconductor device.

FIG. 7 is a sectional perspective view for describing the normal operation of the semiconductor device 1 shown in FIG. 1. FIG. 8 is a sectional perspective view for describing the active clamp operation of the semiconductor device 1 shown in FIG. 1. In FIG. 7 and FIG. 8, for convenience of description, structures in the first main surface 3 are omitted and the gate control wiring 17 is simplified.

With reference to FIG. 7, when the power MISFET 9 is in the normal operation, a first ON signal Von1 is input to the first gate control wiring 17A, a second ON signal Von2 is input to the second gate control wiring 17B, and a third ON signal Von3 is input to the third gate control wiring 17C.

The first ON signal Von1, the second ON signal Von2, and the third ON signal Von3 are each input from the control IC 10. The first ON signal Von1, the second ON signal Von2, and the third ON signal Von3 each have a voltage equal to or higher than the gate threshold voltage Vth. The first ON signal Von1, the second ON signal Von2, and the third ON signal Von3 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 7, the first channel region 91 and the second channel region 111 in the ON states are indicated by dotted hatching.

As a result, the first MISFET 56 and the second MISFET 57 are both driven (Full-ON control). A channel utilization rate RU in the normal operation is 100%. A characteristics channel rate RC in the normal operation is 50%. The channel utilization rate RU is a rate of the first channel region 91 and the second channel region 111 which are controlled in the ON state, of the first channel region 91 and the second channel region 111.

The characteristics channel rate RC is a value obtained by multiplying the average channel rate RAV by a channel utilization rate RU (RC=RAV×RU). The characteristics (the area resistivity Ron·A and the active clamp capability Eac) of the power MISFET 9 are determined based on the characteristics channel rate RC. Thereby, the area resistivity Ron·A approaches the area resistivity Ron·A indicated by the second plot point P2 in the graph of FIG. 6.

On the other hand, with reference to FIG. 8, when the power MISFET 9 is in the active clamp operation, an OFF signal Voff is input to the first gate control wiring 17A, a first clamp ON signal VCon1 is input to the second gate control wiring 17B, and a second clamp ON signal VCon2 is input to the third gate control wiring 17C.

The OFF signal Voff, the first clamp ON signal VCon1, and the second clamp ON signal VCon2 are each input from the control IC 10. The OFF signal Voff has a voltage less than the gate threshold voltage Vth (for example, the reference voltage). The first clamp ON signal VCon1 and the second clamp ON signal VCon2 each have a voltage equal to or higher than the gate threshold voltage Vth. The first clamp ON signal VCon1 and the second clamp ON signal VCon2 may each have an equal voltage. The first clamp ON signal VCon1 and the second clamp ON signal VCon2 may have a voltage not more than or less than a voltage in the normal operation.

In this case, the first opening-side electrode 87 is put into the OFF state, and the first bottom-side electrode 86, the second bottom-side electrode 106, and the second opening-side electrode 107 are each put into the ON state. Thereby, the first channel region 91 is controlled to be in the OFF state, and the second channel region 111 is controlled to be in the ON state. In FIG. 8, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 6.

In this case, the control IC 10 controls the first MISFET 56 and the second MISFET 57 such that different characteristics channel rates RC (channel areas) are applied between in the normal operation and in the active clamp operation. Specifically, the control IC 10 controls the first MISFET 56 and the second MISFET 57 such that the channel utilization rate RU in the active clamp operation is more than zero but less than the channel utilization rate RU in the normal operation.

More specifically, the control IC 10 controls the first MISFET 56 and the second MISFET 57 to be in the ON states in (during) the normal operation, and controls the first MISFET 56 to be in the OFF state and the second MISFET 57 to be in the ON state in (during) the active clamp operation.

Therefore, in the normal operation, the characteristics channel rate RC is relatively increased; that is, in the normal operation, a current is allowed to flow by using the first MISFET 56 and the second MISFET 57. Thereby, with an increased current path, it is possible to reduce the area resistivity Ron·A (ON resistance).

On the other hand, in the active clamp operation, the characteristics channel rate RC is relatively reduced; that is, a current is allowed to flow by using the second MISFET 57 in a state where the first MISFET 56 is stopped. Therefore, the counter electromotive force can be consumed (absorbed) by the second MISFET 57. Thereby, it is possible to suppress a sharp temperature rise due to the counter electromotive force and therefore it is possible to improve the active clamp capability Eac.

Thus, it is possible to provide the semiconductor device 1 capable of realizing both of an excellent area resistivity Ron·A and an excellent active clamp capability Eac, independently of the trade-off relationship shown in FIG. 6.

The control example described above deals with an example where second Half-ON control is applied in the active clamp operation. Instead, first Half-ON control may be applied in the active clamp operation.

Figure 9:
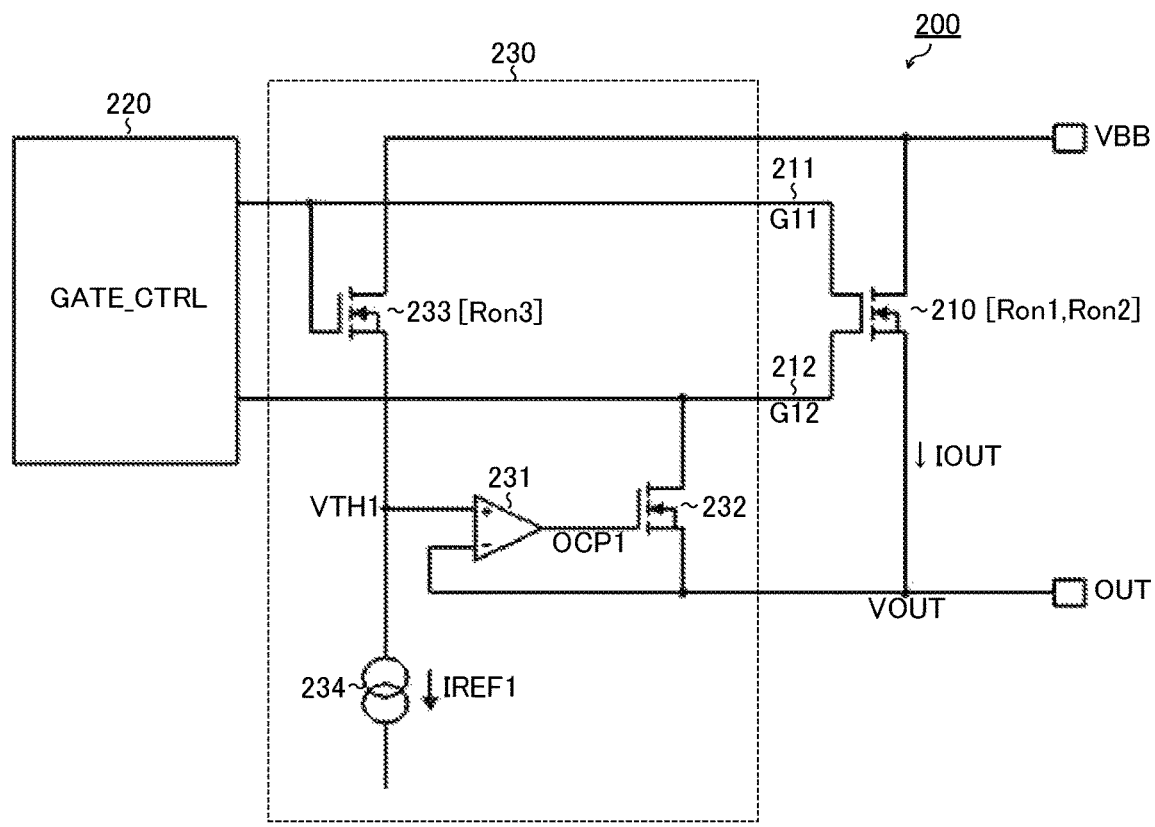
FIG. 9 is a diagram showing an overcurrent protection circuit of a first configuration example.

Overcurrent Protection Circuit: FIG. 9 is a diagram showing an overcurrent protection circuit of a first configuration example to be incorporated in a semiconductor device. The semiconductor device 200 shown there, like the semiconductor device 1 described previously, functions as a high-side switching IC of which an output electrode OUT (the source electrode 12 described previously) formed on a first main surface (top, or obverse, side) of a semiconductor substrate is connected to a load (not shown) and of which a power electrode VBB (the drain electrode 11 described previously) formed on a second main surface (bottom, or reverse, side) of the semiconductor substrate is connected to a power terminal (not shown).

The semiconductor device 200 includes a power MISFET 210, a gate control circuit 220, and an overcurrent protection circuit 230.

The power MISFET 210, like the power MISFET 9 described previously, is a split-gate power transistor configured to have a first and a second channel region that are controlled individually in accordance with a first gate control signal G11 input via a first gate control wiring 211 and a second gate control signal G12 input via a second gate control wiring 212.

For example, the ON resistance Ron of the power MISFET 210, with both channel regions on, equals an ON resistance Ron1 and, with only one channel region on, equals an ON resistance Ron2 higher than the ON resistance Ron1 (e.g., Ron2=20×Ron1). Specifically, for example, Ron1=0.05Ω and Ron2=1Ω.

The gate control circuit 220 is a circuit block that corresponds to the gate control circuit 25 described previously. The gate control circuit 220 is configured to generate the first and second gate control signals G11 and G12 and feed them via the first and second gate control wirings 211 and 212, respectively, to the power MISFET 210.

The overcurrent protection circuit 230 is a circuit block that corresponds to the overcurrent protection circuit 34 described previously. The overcurrent protection circuit 230 is configured to turn off the second channel region when the output current IOUT passing through the power MISFET 210 exceeds a predetermined threshold current ITH.

In terms of what is shown in FIG. 9, the overcurrent protection circuit 230 includes a comparator 231, N-channel MISFETs 232 and 233, and a current source 234.

The comparator 231 is configured to generate an overcurrent protection signal OCP1 by comparing a predetermined threshold voltage VTH1, which is fed to the non-inverting input terminal (+) of the comparator 231, with an output voltage VOUT (i.e., the terminal voltage at the output electrode OUT, VBB−IOUT×Ron), which is fed to the inverting input terminal (−) of the comparator 231. For example, the overcurrent protection signal OCP1 is at low level (i.e., the logic level corresponding to an overcurrent not being sensed) when VOUT>VTH1, and is at high level (i.e., the logic level corresponding to an overcurrent being sensed) when VOUT<VTH1.

The MISFET 232 corresponds to a first transistor configured to switch between a conducting state and a cut-off state a path between the second gate control wiring 212 and the output electrode OUT in accordance with the overcurrent protection signal OCP1. The MISFET 232 is off when the overcurrent protection signal OCP1 is at low level, and is on when the overcurrent protection signal OCP1 is at high level. That is, when the overcurrent protection signal OCP1 is at high level (i.e., the logic level corresponding to an overcurrent being sensed), a short circuit forms between the second gate control wiring 212 and the output electrode OUT (and hence the source of the power MISFET 210), and thus the second channel region is off.

The MISFET 233 is connected between the power electrode VBB and an application terminal for the threshold voltage VTH1, and corresponds to a second transistor configured to generate the threshold voltage VTH1 (=VBB−IREF1×Ron3) in accordance with a constant current IREF1 passing through the MISFET 233 and the ON resistance Ron3 of the MISFET 233. Preferably, the MISFET 233 is given an ON resistance Ron3 significantly higher than the ON resistance Ron of the power MISFET 210 (i.e., the ON resistance Ron1 or Ron2). Specifically, for example, Ron3=5 kΩ.

The gate of the MISFET 233 is connected to that one of the first and second gate control wirings 211 and 212 to which the MISFET 232 is not connected (i.e., to the first gate control wiring 211). Accordingly, the MISFET 233 is turned on and off in synchronization with the power MISFET 210. With this configuration, the constant current IREF1 does not pass during the OFF period of the power MISFET 210, and this helps avoid wasting electric power.

Preferably, the MISFET 233 is a split-gate transistor with characteristics paired with those of the power MISFET 210. With this configuration, the threshold voltage VTH1 (and hence the threshold current ITH) can be set accurately, and this helps achieve high accuracy in overcurrent detection.

The current source 234 generates the constant current IREF1 that passes through the MISFET 233. Specifically, for example, IREF1=100 μA.

Figure 10:
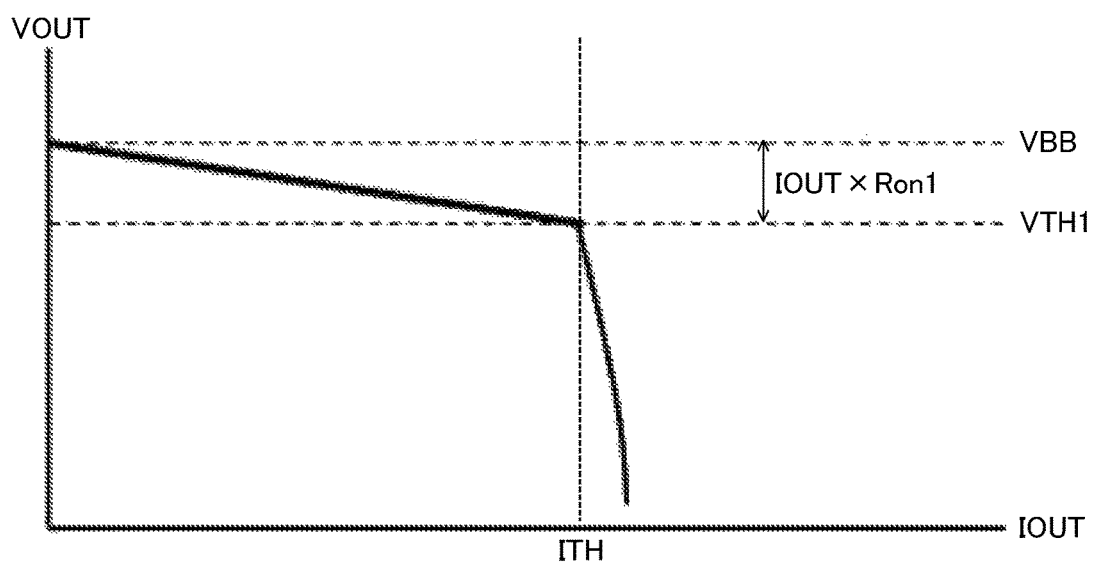
FIG. 10 is a diagram showing one example of overcurrent protection operation in the first configuration example.

FIG. 10 is a diagram showing one example of overcurrent protection operation during the ON period of the power MISFET 210. The horizontal axis indicates the output current IOUT that passes through the power MISFET 210, and the vertical axis indicates the output voltage OUT that appears at the output electrode OUT.

When IOUT<ITH (=IREF1×Ron3/Ron1), the voltage drop across the power MISFET 210 is relatively small, so that VOUT (=VBB−IOUT×Ron1)>VTH1 (=VBB−IREF1×Ron3). In this condition, the overcurrent protection signal OCP1 is at low level, and the MISFET 232 is off; thus an open circuit forms between the second gate control wiring 212 and the output electrode OUT. Accordingly, the first and second channel regions of the power MISFET 210 are both on, so that the ON resistance Ron of the power MISFET 210 is set at the ON resistance Ron 1 (e.g., 0.05Ω).

In contrast, when the output current IOUT increases such that IOUT>ITH, then VOUT<VTH1. In this condition, the overcurrent protection signal OCP1 is at high level, and the MISFET 232 is on; thus a short circuit forms between the second gate control wiring 212 and the output electrode OUT. Accordingly, the second channel region of the power MISFET 210 is off and only its first channel region is on, so that the ON resistance Ron of the power MISFET 210 is raised from the ON resistance Ron1 to the ON resistance Ron 2 (e.g., 1Ω). In this way, the output current IOUT that passes through the power MISFET 210 is restricted.

For example, suppose Ron1=0.05Ω, Ron2=1Ω, Ron3=5 kΩ, IREF1=100 μA, and VBB=14 V. Then, when the output current IOUT exceeds 10 A, the ON resistance Ron of the power MISFET 210 is raised from the ON resistance Ron1 to the ON resistance Ron2, so that the output current IOUT is restricted to a predetermined upper limit value (=VBB/Ron2=14 A).

What is notable about the overcurrent protection circuit 230 of this configuration example, in contrast to conventional configurations relying on gate feedback control for a power transistor, is its simple circuit configuration that does not require large devices (such as a phase compensation capacitor and a current sense resistor). This is suitable for, for example, low-price products in which area efficiency is highly valued. Although the omission of gate feedback control for the power MISFET 210 is accompanied by variation and temperature-dependence of the ON resistance Ron, these pose almost no problem in the face of the purpose of preventing destruction of the semiconductor device 200.

Figure 11:
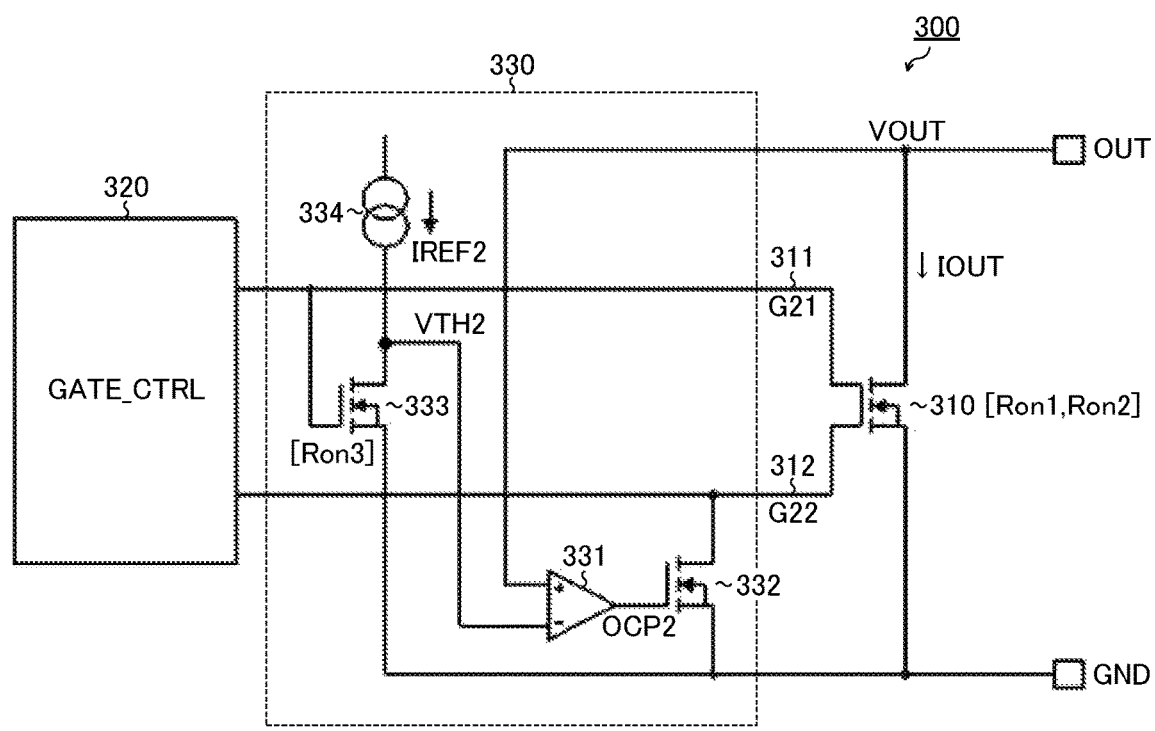
FIG. 11 is a diagram showing an overcurrent protection circuit of a second configuration example.

FIG. 11 is a diagram showing an overcurrent protection circuit of a second configuration example to be incorporated in a semiconductor device. The semiconductor device 300 shown there differs from the semiconductor devices 1 and 200 described previously in that it functions as a low-side switching IC of which a ground electrode GND is connected to a ground terminal (not shown) and of which an output electrode OUT is connected to a load (not shown).

The semiconductor device 300 includes a power MISFET 310, a gate control circuit 320, and an overcurrent protection circuit 330.

The power MISFET 310, like the power MISFETs 9 and 210 described previously, is a split-gate power transistor configured to have a first and a second channel region that are controlled individually in accordance with a first gate control signal G21 input via a first gate control wiring 311 and a second gate control signal G22 input via a second gate control wiring 312.

For example, the ON resistance Ron of the power MISFET 310, with both channel regions on, equals an ON resistance Ron1 and, with only one channel region on, equals an ON resistance Ron2 higher than the ON resistance Ron1 (e.g., Ron2=20×Ron1). Specifically, for example, Ron1=0.05Ω and Ron2=1Ω.

The gate control circuit 320 is a circuit block that corresponds to the gate control circuits 25 and 220 described previously. The gate control circuit 320 is configured to generate the first and second gate control signals G21 and G22 and feed them via the first and second gate control wirings 311 and 312, respectively, to the power MISFET 310.

The overcurrent protection circuit 330 is a circuit block that corresponds to the overcurrent protection circuits 34 and 230 described previously. The overcurrent protection circuit 330 is configured to turn off the second channel region when the output current IOUT passing through the power MISFET 310 exceeds a predetermined threshold current ITH.

In terms of what is shown in FIG. 11, the overcurrent protection circuit 330 includes a comparator 331, N-channel MISFETs 332 and 333, and a current source 334.

The comparator 331 is configured to generate an overcurrent protection signal OCP2 by comparing an output voltage VOUT (i.e., the terminal voltage at the output electrode OUT, IOUT×Ron), which is fed to the non-inverting input terminal (+) of the comparator 331, with a predetermined threshold voltage VTH2, which is fed to the inverting input terminal (−) of the comparator 331. For example, the overcurrent protection signal OCP2 is at low level (i.e., the logic level corresponding to an overcurrent not being sensed) when VOUT<VTH2, and is at high level (i.e., the logic level corresponding to an overcurrent being sensed) when VOUT>VTH2.

The MISFET 332 corresponds to a first transistor configured to switch between a conducting state and a cut-off state a path between the second gate control wiring 312 and the output electrode OUT in accordance with the overcurrent protection signal OCP2. The MISFET 332 is off when the overcurrent protection signal OCP2 is at low level, and is on when the overcurrent protection signal OCP2 is at high level. That is, when the overcurrent protection signal OCP2 is at high level (i.e., the logic level corresponding to an overcurrent being sensed), a short circuit forms between the second gate control wiring 312 and the output electrode OUT (and hence the source of the power MISFET 310), and thus the second channel region is off.

The MISFET 333 is connected between the ground electrode GND and an application terminal for the threshold voltage VTH2, and corresponds to a second transistor configured to generate the threshold voltage VTH2 (=IREF2× Ron3) in accordance with a constant current IREF2 passing through the MISFET 333 and the ON resistance Ron3 of the MISFET 333. Preferably, the MISFET 333 is given an ON resistance Ron3 significantly higher than the ON resistance Ron of the power MISFET 310 (i.e., the ON resistance Ron1 or Ron2). Specifically, for example, Ron3=5 kΩ.

The gate of the MISFET 333 is connected to that one of the first and second gate control wirings 311 and 312 to which the MISFET 332 is not connected (i.e., to the first gate control wiring 311). Accordingly, the MISFET 333 is turned on and off in synchronization with the power MISFET 310. With this configuration, the constant current IREF2 does not pass during the OFF period of the power MISFET 310, and this helps avoid wasting electric power.

Preferably, the MISFET 333 is a split-gate transistor with characteristics paired with those of the power MISFET 310. With this configuration, the threshold voltage VTH2 (and hence the threshold current ITH) can be set accurately, and this helps achieve high accuracy in overcurrent detection.

The current source 334 generates the constant current IREF2 that passes through the MISFET 333. Specifically, for example, IREF2=100 μA.

Figure 12:
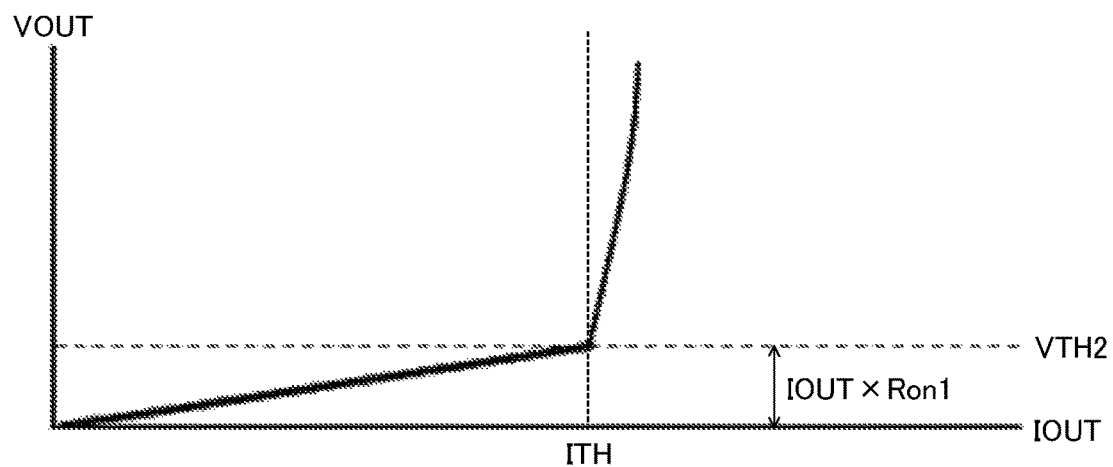
FIG. 12 is a diagram showing one example of overcurrent protection operation in the second configuration example.

FIG. 12 is a diagram showing one example of overcurrent protection operation during the ON period of the power MISFET 310. The horizontal axis indicates the output current IOUT that passes through the power MISFET 310, and the vertical axis indicates the output voltage OUT that appears at the output electrode OUT.

When IOUT<ITH (=IREF2×Ron3/Ron1), the voltage drop across the power MISFET 310 is relatively small, so that VOUT (=IOUT×Ron1)<VTH2 (=IREF2×Ron3). In this condition, the overcurrent protection signal OCP2 is at low level, and the MISFET 332 is off; thus an open circuit forms between the second gate control wiring 312 and the output electrode OUT. Accordingly, the first and second channel regions of the power MISFET 310 are both on, so that the ON resistance Ron of the power MISFET 310 is set at the ON resistance Ron 1 (e.g., 0.05Ω).

In contrast, when the output current IOUT increases such that IOUT>ITH, then VOUT>VTH2. In this condition, the overcurrent protection signal OCP2 is at high level, and the MISFET 332 is on; thus a short circuit forms between the second gate control wiring 312 and the output electrode OUT. Accordingly, the second channel region of the power MISFET 310 is off and only its first channel region is on, so that the ON resistance Ron of the power MISFET 310 is raised from the ON resistance Ron1 to the ON resistance Ron 2 (e.g., 1Ω). In this way, the output current IOUT that passes through the power MISFET 310 is restricted.

For example, suppose Ron1=0.05Ω, Ron2=1Ω, Ron3=5 kΩ, IREF2=100 μA, and VBB=14 V. Then, when the output current IOUT exceeds 10 A, the ON resistance Ron of the power MISFET 310 is raised from the ON resistance Ron1 to the ON resistance Ron2, so that the output current IOUT is restricted to a predetermined upper limit value (=VBB/Ron2=14 A).

What is notable about the overcurrent protection circuit 330 of this configuration example, in contrast to conventional configurations relying on gate feedback control for a power transistor, is its simple circuit configuration that does not require large devices (such as a phase compensation capacitor and a current sense resistor). This is suitable for, for example, low-price products in which area efficiency is highly valued. Although the omission of gate feedback control for the power MISFET 310 is accompanied by variation and temperature-dependence of the ON resistance Ron, these pose almost no problem in the face of the purpose of preventing destruction of the semiconductor device 300.

Split-Gate Configuration vs. Parallel-Connected Configuration: Instead of either of the split-gate power MISFETs 210 and 310, a plurality of power transistors with different ON resistances can be connected in parallel with each other and these can be controlled individually to achieve overcurrent protection similar to that described above.

However, with a configuration that uses parallel-connected power transistors, when an overcurrent is detected, the output current passes in a concentrated manner only through power transistors with small areas and hence with high resistances. This tends to lead to such heat generation in power transistors as cannot be left unaddressed.

In contrast, with a configuration that uses a split-gate power transistor like the power MISFETs 210 and 310, when an overcurrent is detected, even with the ON resistance Ron of the power MISFETs 210 and 310 raised, the output current IOUT passes through the power MISFETs 210 and 310 in a manner distributed over the entire area where they are formed. This makes heat-induced destruction of the device less likely.

Figure 13:
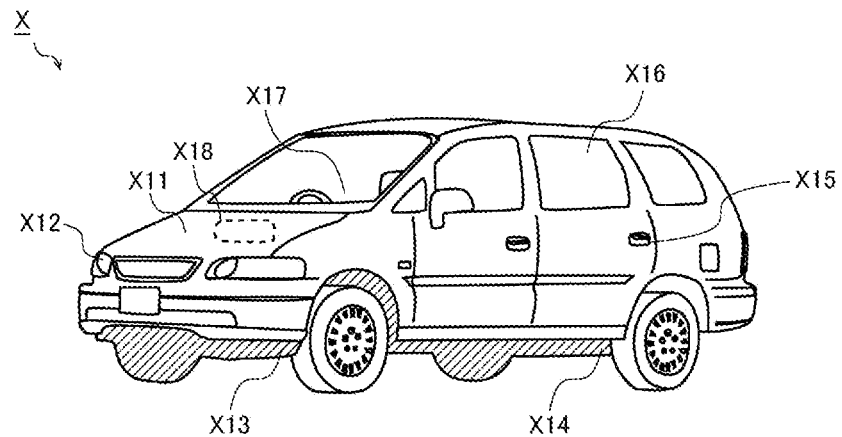
FIG. 13 is an exterior view showing one example of a vehicle.

Application to Vehicles: FIG. 13 is an exterior view showing one example of a vehicle. The vehicle X of this configuration example incorporates a battery (not shown in FIG. 13) and various electronic appliances X11 to X18 that operate by being fed with a voltage supplied from the battery. For the sake of convenience, FIG. 13 may not show the electronic appliances X11 to X18 at the places where they are actually arranged.

The electronic appliance X11 is an engine control unit that performs control with respect to an engine (injection control, electronic throttle control, idling control, oxygen sensor heater control, automatic cruise control, etc.).

The electronic appliance X12 is a lamp control unit that controls the lighting and extinguishing of HIDs (high-intensity discharged lamps), DRLs (daytime running lamps), and the like.

The electronic appliance X13 is a transmission control unit that performs control with respect to a transmission.

The electronic appliance X14 is a body control unit that performs control with respect to the movement of the vehicle X (ABS [anti-lock brake system] control, EPS [electric power steering] control, electronic suspension control, and the like).

The electronic appliance X15 is a security control unit that drives and controls door locks, burglar alarms, and the like.

The electronic appliance X16 comprises electronic appliances incorporated in the vehicle X as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle X optionally as user-fitted equipment, such as AN (audio/visual) equipment, a car navigation system, and an ETC (electronic toll control system).

The electronic appliance X18 comprises electronic appliances provided with high-withstand-voltage motors, such as a vehicle-mounted blower, an oil pump, a water pump, and a battery cooling fan.

Any of the semiconductor devices 1, 200, and 300 described previously can be incorporated in any of the electronic appliances X11 to X18.

Overview: To follow is an overview of the various embodiments described above.

For example, according to one aspect of what is disclosed herein, a semiconductor device includes: a split-gate power transistor configured to have a plurality of channel regions that are controlled individually in accordance with a plurality of gate control signals; a gate control circuit configured to generate the plurality of gate control signals; and an overcurrent protection circuit configured to turn off at least one of the plurality of channel regions when the output current that passes through the power transistor exceeds a threshold voltage (a first configuration).

In the semiconductor device of the first configuration described above, the power transistor may have: a first electrode formed on a first main surface of a semiconductor substrate; and a second electrode formed on a second main surface of the semiconductor substrate (a second configuration).

In the semiconductor device of the second configuration described above, the overcurrent protection circuit may include: a comparator configured to generate an overcurrent protection signal by comparing a predetermined threshold voltage with at terminal voltage at the first electrode; and a first transistor configured to switch between a conducting state and a cut-off state a path between at least one of the plurality of gate control wirings and the first electrode in accordance with the overcurrent protection signal (a third configuration).

In the semiconductor device of the third configuration described above, the overcurrent protection circuit may further include: a second transistor connected between the second or first electrode and an application terminal for the threshold voltage, wherein the second transistor may be configured to generate the threshold voltage with the constant current that passes through the second transistor (a fourth configuration).

In the semiconductor device of the fourth configuration described above, the second transistor may be turned on and off in synchronization with the power transistor (a fifth configuration).

In the semiconductor device of the fourth or fifth configuration described above, the second transistor may be a split-gate transistor having characteristics paired with characteristics of the power transistor (a sixth configuration).

In the semiconductor device of any of the first to sixth configurations described above, the power transistor may function as a high-side switch of which the first electrode is connected to a load and of which the second electrode is connected to a power terminal (a seventh configuration).

In the semiconductor device of any of the first to sixth configurations described above, the power transistor functions as a low-side switch of which the first electrode is connected to a ground terminal and of which the second electrode is connected to a load (an eighth configuration).

For example, according to another aspect of what is disclosed herein, an electronic appliance includes: the semiconductor device of any of the first to eighth configurations described above; and a load connected to the semiconductor device (a ninth configuration).

For example, according to yet another aspect of what is disclosed herein, a vehicle includes: the electronic appliance of the ninth configuration described above (a tenth configuration).

OTHER MODIFICATIONS

In the above embodiment, the vehicle-mounted high-side switch IC has been described as an example, but the application of the invention disclosed in the present specification is not limited to this. It can be widely applied to all semiconductor devices having a power transistor, including an vehicle-mounted IPD [intelligent power device] (an vehicle-mounted low-side switch IC, an vehicle-mounted power supply IC, etc.) used for other purposes.

The inventions disclosed herein may be implemented in any other manner than as in the embodiments described above, and allow for many modifications without departing from the spirit of the present invention. That is, the embodiments descried above should be understood to be in every aspect illustrative and not restrictive. The technical scope of the present invention is defined not by the description of the embodiments given above but by the appended claims, and should be understood to encompass any modifications made in a sense and scope equivalent to the claims.

What is claimed is:

1. A semiconductor device comprising:
   a split-gate power transistor configured to have a plurality of channel regions that are controlled individually in accordance with a plurality of gate control signals;
   a gate control circuit configured to generate the plurality of gate control signals; and
   an overcurrent protection circuit configured to turn off at least one of the plurality of channel regions when an output current that passes through the power transistor exceeds a threshold voltage,
   wherein the power transistor comprises
      a first electrode formed on a first main surface of a semiconductor substrate, and
      a second electrode formed on a second main surface of the semiconductor substrate,
   wherein the overcurrent protection circuit comprises
      a comparator configured to generate an overcurrent protection signal by comparing a predetermined threshold voltage with a terminal voltage at the first electrode;
      a first transistor configured to switch a path between a conducting state and a cut-off state, the path laid between at least one of a plurality of gate control wirings and the first electrode in accordance with the overcurrent protection signal; and
   the overcurrent protection circuit further comprises:
      a second transistor connected between the second or first electrode and an application terminal for the threshold voltage, the second transistor being configured to generate the threshold voltage with a constant current that passes through the second transistor,
   the power transistor configured to have a first on-resistance value when both a first channel region and a second channel region are turned on,
   the power transistor configured to have a second on-resistance value when the first channel region is turned on and the second channel region is turned off, the second on-resistance value being higher than the first on-resistance value, and
   the second transistor configured to have a third on-resistance higher than the second on-resistance value.

2. The semiconductor device according to claim 1, wherein
   the second transistor is turned on and off in synchronization with the power transistor.

3. The semiconductor device according to claim 1, wherein
   the second transistor is a split-gate transistor having characteristics paired with characteristics of the power transistor.

4. The semiconductor device according to claim 1, wherein
   the power transistor functions as a high-side switch of which the first electrode is connected to a load and of which the second electrode is connected to a power terminal.

5. The semiconductor device according to claim 1, wherein
   the power transistor functions as a low-side switch of which the first electrode is connected to a ground terminal and of which the second electrode is connected to a load.

6. An electronic appliance comprising:
   the semiconductor device according to claim 1; and
   a load connected to the semiconductor device.

7. A vehicle comprising:
   the electronic appliance according to claim 6.

* * * * *